(12) United States Patent
Ushiyama et al.

(10) Patent No.: US 8,584,069 B2
(45) Date of Patent: Nov. 12, 2013

(54) APPARATUS AND METHOD FOR DESIGN SUPPORT USING LAYOUT POSITIONS OF FIRST AND SECOND TERMINALS

(75) Inventors: Kenichi Ushiyama, Yokohama (JP); Shigenori Ichinose, Yokohama (JP); Kenji Suzuki, Yokohama (JP); Kenji Kumagai, Yokohama (JP); Takafumi Miyahara, Yokohama (JP); Shuji Tanahashi, Yokohama (JP); Hideto Fukuda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 7 days.

(21) Appl. No.: 12/892,481

(22) Filed: Sep. 28, 2010

(65) Prior Publication Data

US 2011/0078646 A1 Mar. 31, 2011

(30) Foreign Application Priority Data

Sep. 29, 2009 (JP) ................................. 2009-223871

(51) Int. Cl.
*G06F 17/50* (2006.01)
(52) U.S. Cl.
USPC ........... 716/119; 716/118; 716/126; 716/130; 716/139
(58) Field of Classification Search
USPC ............. 716/50–56, 103, 126–132, 118, 119, 716/139
See application file for complete search history.

(56) References Cited

U.S. PATENT DOCUMENTS

| | | | |
|---|---|---|---|
| 5,517,041 A | 5/1996 | Torii et al. | |
| 5,859,449 A * | 1/1999 | Kobayashi et al. | 257/211 |
| 6,983,431 B2 * | 1/2006 | Donelly et al. | 716/122 |
| 7,055,114 B2 * | 5/2006 | Kever et al. | 716/52 |
| 7,424,695 B2 * | 9/2008 | Tamura et al. | 716/130 |
| 2003/0023938 A1 * | 1/2003 | Nagasaka et al. | 716/2 |
| 2006/0265678 A1 * | 11/2006 | Okabe | 716/6 |
| 2008/0216026 A1 * | 9/2008 | Gotou | 716/2 |
| 2009/0288054 A1 * | 11/2009 | Okamoto | 716/10 |

FOREIGN PATENT DOCUMENTS

| | | |
|---|---|---|
| JP | 58-166742 A | 10/1983 |
| JP | 62-039024 | 2/1987 |
| JP | 04-163963 A | 6/1992 |
| JP | 07-311789 | 11/1995 |
| JP | 3275313 B | 4/2002 |
| WO | WO93/05537 | 3/1993 |

OTHER PUBLICATIONS

"Japanese Office Action" mailed by JPO and corresponding to Japanese application No. 2009-223871 on Feb. 26, 2013, with partial English translation.

* cited by examiner

*Primary Examiner* — Nha Nguyen
(74) *Attorney, Agent, or Firm* — Fujitsu Patent Center

(57) ABSTRACT

A design support method executed by a computer includes: detecting a layout position of a first terminal in a cell as a first layout position from layout data including a cell of a macro which is arranged at a plurality of orientations, the first terminal being arranged at a first orientation; calculating a second layout position of a first terminal which is arranged at a second orientation which is different from the first orientation based on a variation from the first orientation to the second orientation and the first layout position; associating the second layout position with the first layout position and the layout data; and outputting an association result.

6 Claims, 23 Drawing Sheets

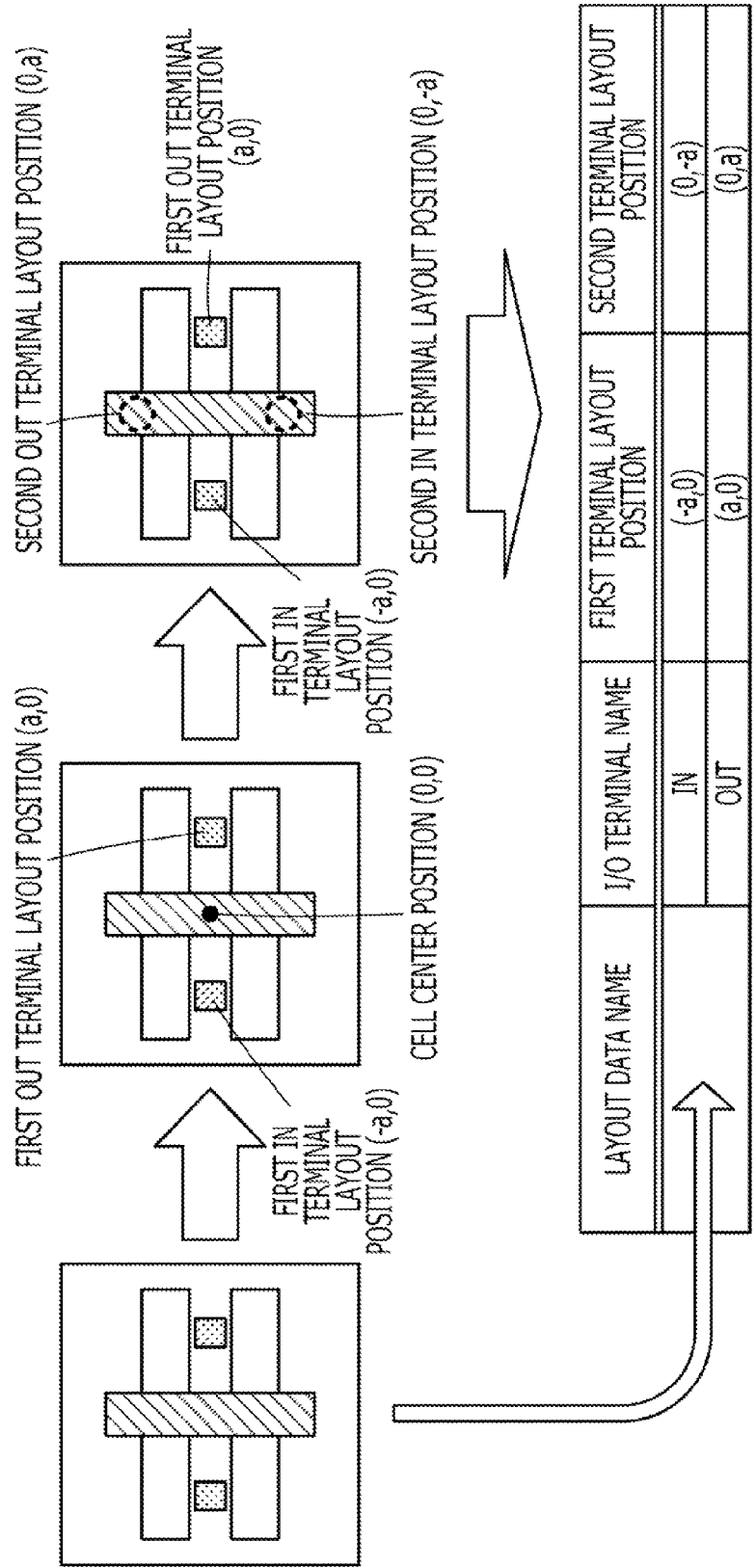

FIG.23
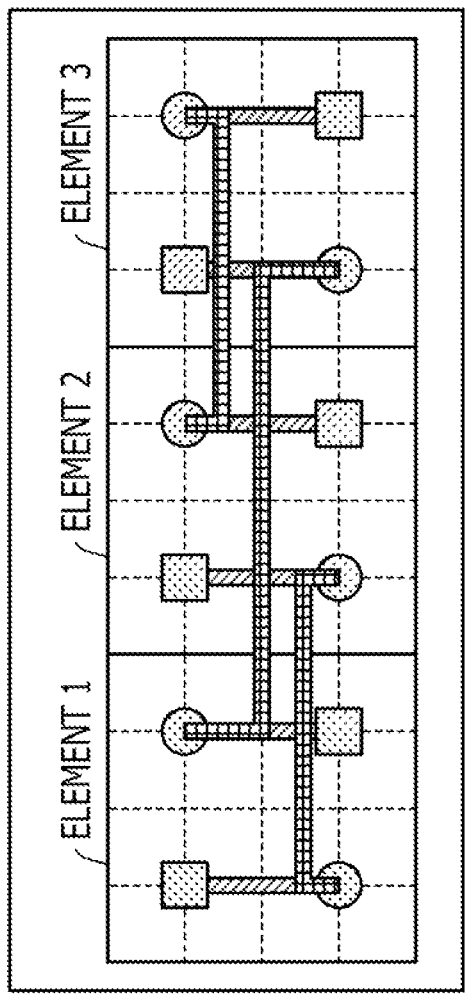
(HORIZONTALLY-ORIENTED MACRO)
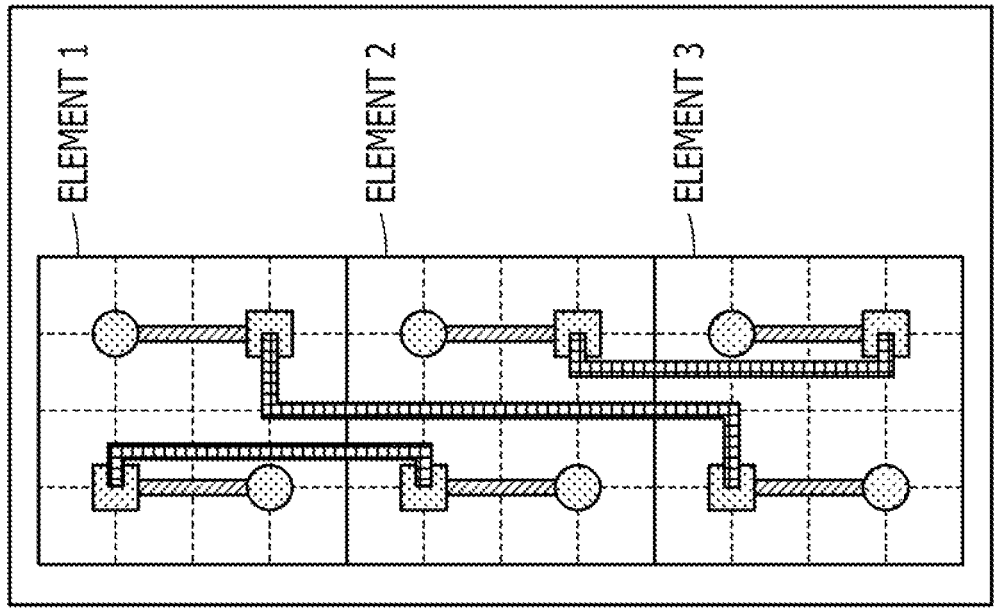
(VERTICALLY-ORIENTED MACRO)

APPARATUS AND METHOD FOR DESIGN SUPPORT USING LAYOUT POSITIONS OF FIRST AND SECOND TERMINALS

CROSS-REFERENCE TO RELATED APPLICATIONS

This application claims the benefit of priority from Japanese Patent Application No. 2009-223871 filed on Sep. 29, 2009, the entire contents of which are incorporated herein by reference.

BACKGROUND

1. Field

The embodiments discussed herein relate to designing layout data for a circuit.

2. Description of Related Art

In a layout of semiconductor integrated circuits, transistors may be laid out so that they have substantially the same pitch and faces substantially the same direction in order to improve yield or reduce irregularities.

Related art is disclosed in Japanese Laid-open Patent Publication No. H04-163963, Japanese Laid-open Patent Publication No. 558-166742, and Japanese Patent No. 3275313, for example.

SUMMARY

According to one example of the embodiments, a design support method executed by a computer is provided which includes: detecting a layout position of a first terminal in a circuit cell (hereinafter, "cell" or "cells") as a first layout position from layout data including a cell of a macro which is arranged at a plurality of orientations, the first terminal being arranged at a first orientation; calculating a second layout position of a first terminal which is arranged at a second orientation which is different from the first orientation based on a variation from the first orientation to the second orientation and the first layout position; associating the second layout position with the first layout position and the layout data; and outputting an association result.

It is to be understood that both the foregoing general description and the following detailed description are exemplary and explanatory and are not restrictive of the invention, as claimed.

BRIEF DESCRIPTION OF THE DRAWINGS

FIG. 2 illustrates an exemplary layout data;
FIG. 23 illustrates exemplary macro orientations.

DESCRIPTION OF EMBODIMENTS

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present.

Figure 1:
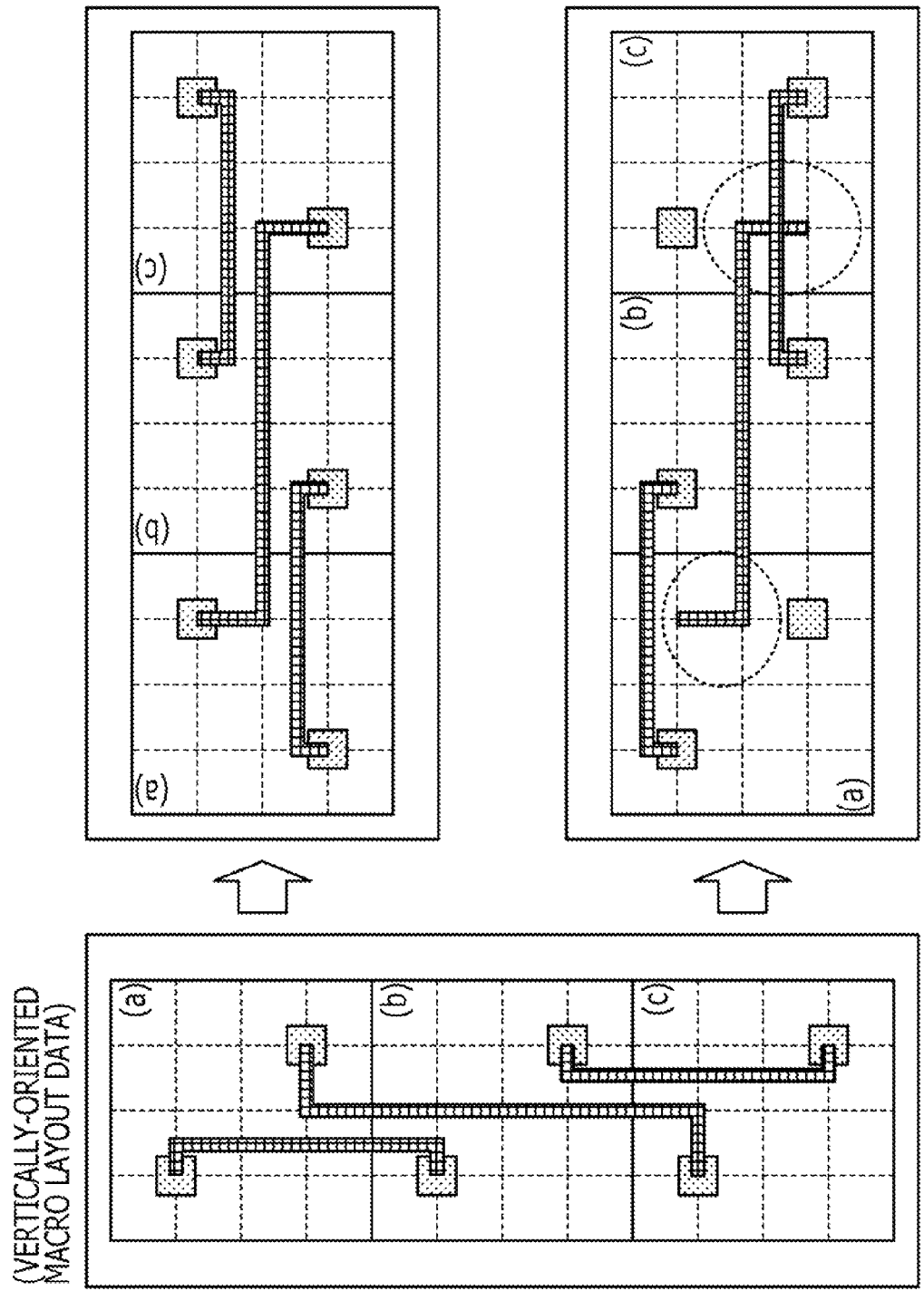
FIG. 1 illustrates an exemplary layout data.

FIG. 1 illustrates an exemplary layout data. For example, when changing a vertically-oriented macro to horizontally-oriented layout, the wire connections may be maintained and the orientation of the circuit cells within the macro may be changed. If the cells in the vertically-oriented macro are rearranged so as to maintain cell orientation, the wire connections of the cells may be changed.

FIG. 2 illustrates an exemplary layout data. A design support apparatus detects layout positions of a cell terminal as the first terminal layout positions from layout data including a plurality cells arranged in a plurality of orientations in a macro. The design support apparatus may detect the layout position of a first terminal of IN that receives an externally-supplied input signal, as well as the layout position of a first terminal OUT that outputs an output signal. Via holes for a given layer may also be detected. Taking the center of the layout data as an origin (0,0), the layout position of the first terminal IN is (−a,0), while the layout position of the first terminal OUT is (a,0).

The design support apparatus calculates the position of a second terminal of a cell arranged in the other orientation that differs from the given orientation of the first terminal based on a variation from the given orientation to the other orientation and the layout position of the first terminal.

A tool for layout design specifies an X axis and a Y axis on the layout data. Using the coordinates of the specified X axis and Y axis, the layout position of a wire and an element is determined. The vertical direction in the drawing indicates the Y axis on the layout data, while the horizontal direction in the drawing indicates the X axis on the layout data. A macro having a vertical length which is longer than a horizontal length may be defined to be a macro arranged in a vertical orientation, for example, a vertically-oriented macro. A macro having a horizontal length which is longer than a vertical length may be defined to be a macro arranged in a horizontal orientation, for example, a horizontally-oriented macro. The second terminal layout positions may be obtained by rotating a 90 degree on the center of the layout data from the first terminal layout position The design support apparatus associates the first terminal layout positions, the second terminal layout positions and the cell layout data. For example, the first terminal layout positions and the second terminal layout positions are associated using a table illustrated in FIG. 2. The layout data may also be associated using the table illustrated in FIG. 2. The design support apparatus outputs the association results.

The design support apparatus inserts a terminal at the second terminal layout positions. The via holes of a certain via layer are inserted at the second terminal layout positions. The design support apparatus couples the first terminals and the second terminals. A macro is thus generated in two orientations including one orientation and the other orientation.

Figure 3B:
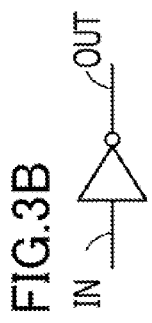
FIG. 3B illustrates an exemplary circuit symbol.
Figure 3A:
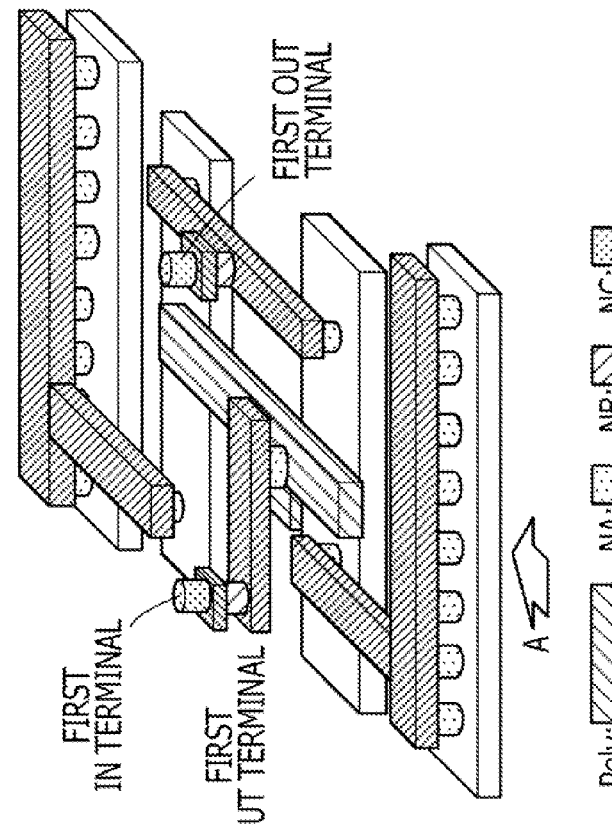
FIG. 3A illustrates an exemplary layout data.

FIG. 3A illustrates an exemplary layout data. The cell layout data illustrated in FIG. 3A includes inverter layout data 200. FIG. 3B illustrates an exemplary circuit symbol. The input terminal of the inverter may be IN, while the output terminal may be OUT. A signal input into IN is inverted and then output from OUT.

The layout data 200 includes diffusion layer area, a polyimide (Poly) layer gate, LA layer wiring, LB layer wiring, NA layer via holes, NB layer via holes, and NC layer via holes. The diffusion layer area and the LA layer wiring are coupled via the NA layer via holes. The Poly layer gate and the LA wiring are coupled via the NA layer via holes. The LA layer wiring and the LB layer wiring are coupled via the NB layer via holes. The cell frame indicating the cell boundary, such as the outer perimeter of the cell, may be square. The transistor level circuits of the inverter may include common circuits. The NC layer via holes may be terminals. The first terminal IN and the first terminal OUT are illustrated. The center of the cell may be taken as the origin.

Figure 3C:
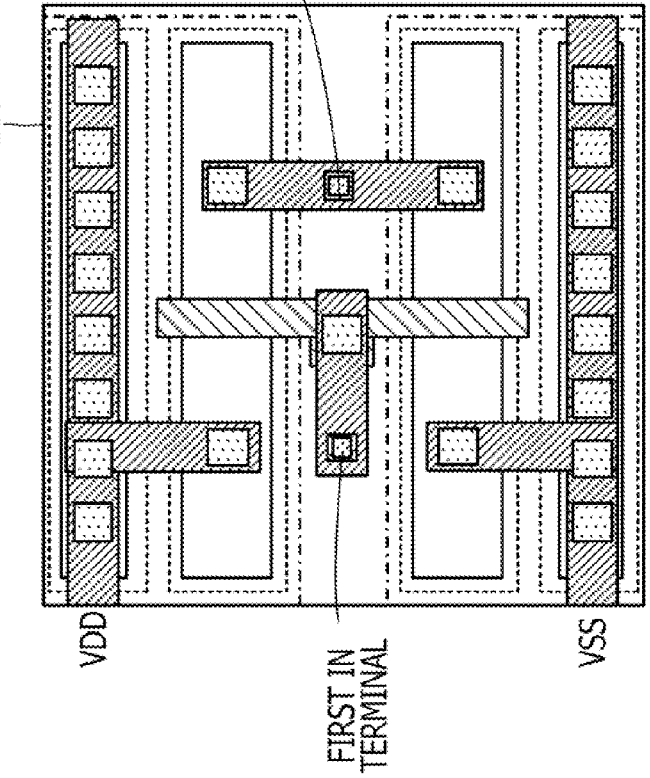
FIG. 3C illustrates an exemplary three-dimensional layout data.

FIG. 3C illustrates an exemplary three-dimensional layout data. The layout data illustrated in FIG. 3C may be a three-dimensional representation of the layout data illustrated in FIG. 3A. The white block indicated at the lowermost layer may be the diffusion layer zone. The first terminal IN is coupled to an external wire, such as the wire from another cell, which is on a higher layer than the LB layer. An external signal is input into the inverter via the first terminal IN. The first terminal OUT is coupled to an external wire, which is on a higher layer than the LB layer. A signal is externally output from the inverter via the first OUT terminal.

The layout data 200 may be stored in a computer-readable storage apparatus.

Figure 4:
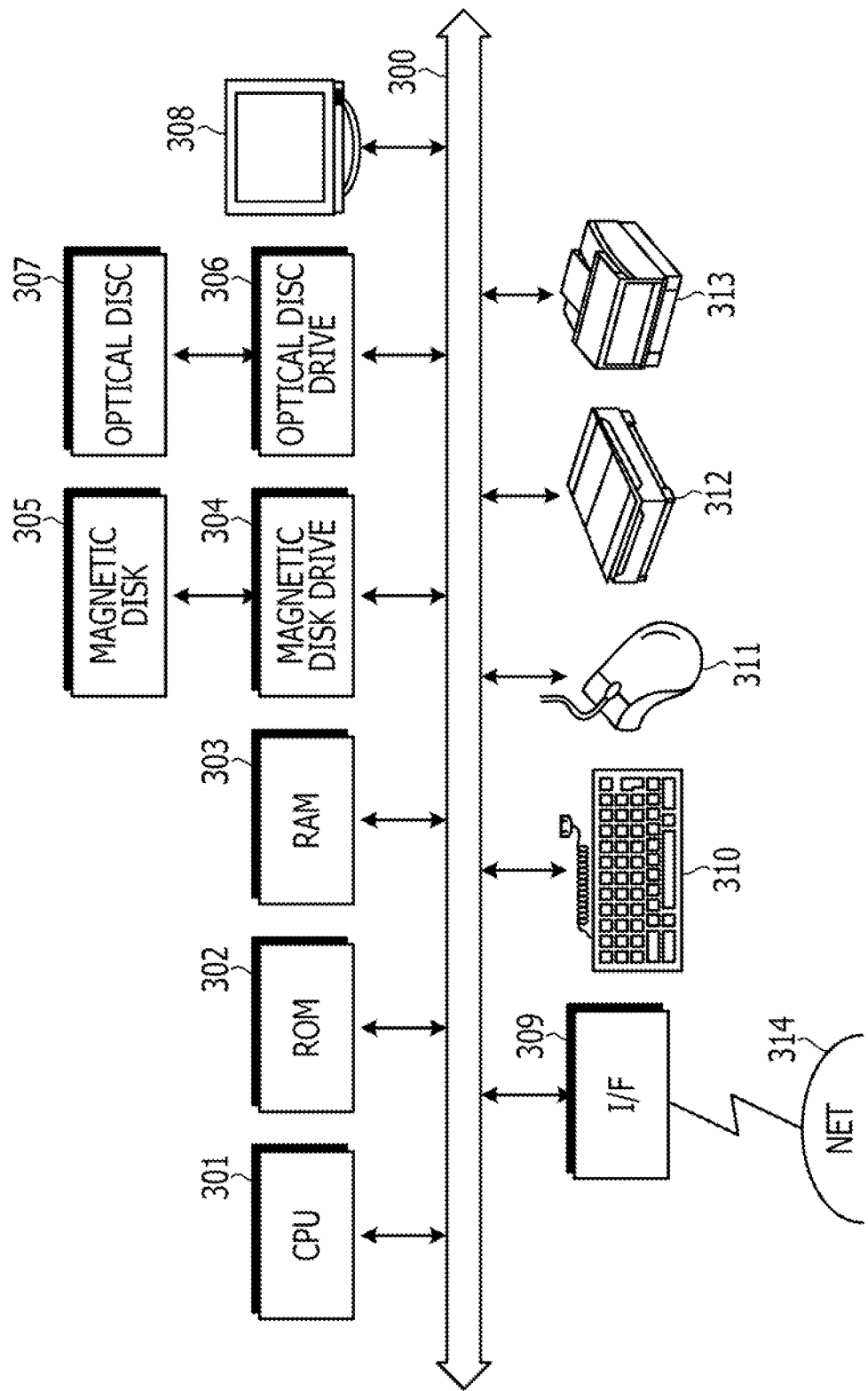
FIG. 4 illustrates an exemplary design support apparatus.

FIG. 4 illustrates an exemplary design support apparatus. The design support apparatus includes a central processing unit (CPU) 301, read-only memory (ROM) 302, random access memory (RAM) 303, a magnetic disk drive 304, a magnetic disk 305, an optical disc drive 306, an optical disc 307, a display 308, an interface (I/F) 309, a keyboard 310, a mouse 311, a scanner 312, and a printer 313. The respective elements are coupled by a bus 300.

The CPU 301 controls the design support apparatus. The ROM 302 may store programs such as boot programs. The RAM 303 may be used as a work area for the CPU 301. In accordance with controls by the CPU 301, the magnetic disk drive 304 controls data read or write from or to the magnetic disk 305. The magnetic disk 305 stores data written thereto by the magnetic disk drive 304.

In accordance with controls by the CPU 301, the optical disc drive 306 controls data read or write from or to the optical disc 307. The optical disc 307 stores data written thereto by the optical disc drive 306. A computer may also read data from the optical disc 307.

The display 308 displays data such as a cursor, icons, tool boxes, text, images and function information. The display 308 may include, for example, a CRT, a TFT liquid crystal display, or a plasma display.

The I/F 309 is coupled to a network 314 by a communication line. The network 314 may include a local area network (LAN), a wide area network (WAN), or the Internet, for example. The I/F 309 is coupled to other apparatus via the network 314. The I/F 309 controls the input or output of data from or to external apparatus as an interface between the network 314 and the internal apparatus. The I/F 309 may include a modem or LAN adapter, for example.

The keyboard 310 inputs data, and includes keys for inputting data such as text, numbers, and various commands. The keyboard 310 may also include elements such as a touch panel input pad or a numeric keypad. The mouse 311 moves the cursor or windows, selects areas, and changes the size of elements. The keyboard 310 may also include a pointing device, track ball, or joystick.

The scanner 312 optically reads images, and inputs image data to the design support apparatus. The scanner 312 may also include optical character recognition (OCR) functions. The printer 313 prints image data and text data. The printer 313 may include a laser printer or an inkjet printer.

Figure 5:
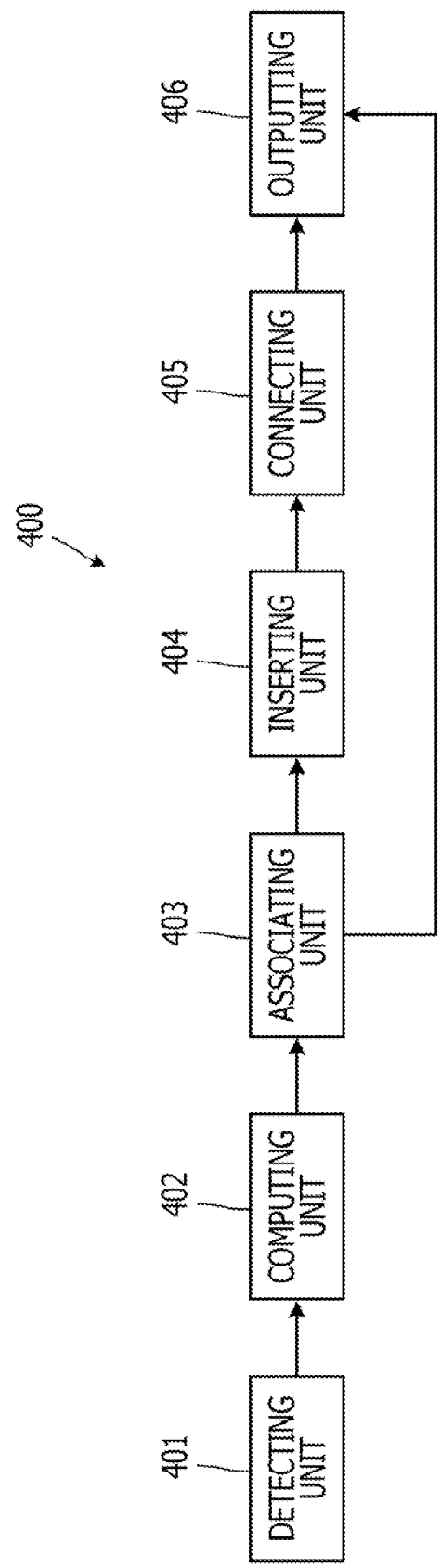
FIG. 5 illustrates an exemplary design support apparatus.

FIG. 5 illustrates an exemplary design support apparatus. The design support apparatus 400 includes a detecting unit 401, a computing unit 402, an associating unit 403, an inserting unit 404, a connecting unit 405, and an outputting unit 406. Those units from the detecting unit 401 to the outputting unit 406 are implemented by the CPU 301 executing a program stored in a storage apparatus such as the ROM 302, the RAM 303, the magnetic disk 305, or the optical disc 307 illustrated in FIG. 4.

The detecting unit 401 detects the layout position of the cell terminal as the first layout position from layout data of cells included in a macro arranged at a plurality of orientations. The terminal of a cell arranged in advance in the layout data may be the first terminal, while newly inserted terminal may be the second terminal. The detecting unit 401 includes a function indicated by the leftmost horizontal arrow in FIG. 2. For example, if the center position of the layout data 200 is taken as the origin (0,0), then the detecting unit 401 may detect the layout position of the first terminal IN (−a,0) as well as the layout position of the first terminal OUT (a,0).

The first terminal may be arranged at the plurality of orientations; thus, when its corresponding first terminal layout positions is at the center of the cell, e.g., at the origin (0,0), new terminals may not be used. For this reason, the operations from the computing unit 402 to the connecting unit 405 may not be performed.

The computing unit 402 calculates the second terminal layout positions arranged at the other orientation which is different from the one orientation at which the first terminal is arranged, based on the variation from the one orientation to the other orientation as well as the first terminal layout positions detected by the detecting unit 401.

For example, the computing unit 402 may calculate the layout position of the second IN terminal based on the layout position of the first terminal IN. When the macro orientations are vertical and horizontal, the computing unit 402 may calculate the layout position of the second terminal IN based on the first terminal layout positions. The layout position of the second terminal IN is obtained by rotating a 90 degree on the center of the origin from the first terminal layout positions. The computing unit 402 substitutes a first terminal layout position into the following equitation and calculates the position obtained by rotating a 90 degree from the first terminal layout position.

$$\vec{P}' = \begin{pmatrix} \cos 90° & -\sin 90° \\ \sin 90° & \cos 90° \end{pmatrix} \times \vec{P} \qquad (1)$$

$$= \begin{pmatrix} 0 & -1 \\ 1 & 0 \end{pmatrix} \times \vec{P}$$

The vector P indicates a first terminal layout position. When a first terminal layout position is P(x,y), the second terminal layout position may be P'(−y,x).

Figure 6:
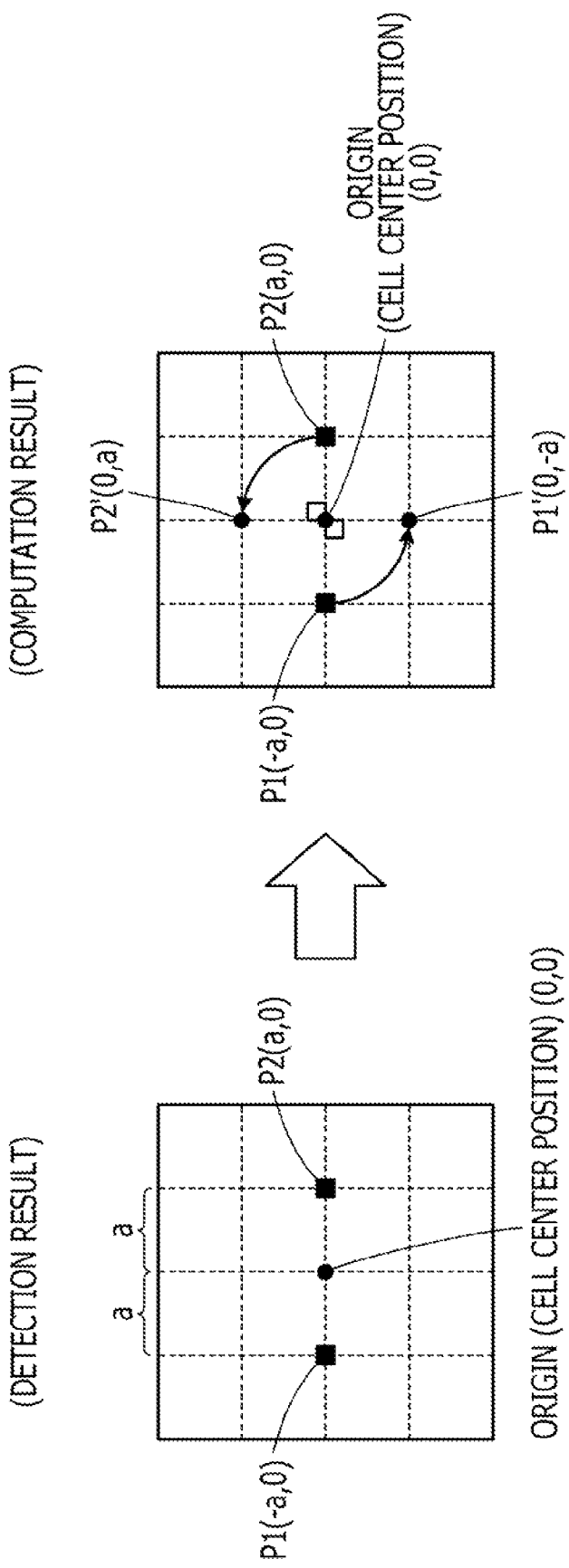
FIG. 6 illustrates an exemplary detection results and computation results.

FIG. 6 illustrates exemplary detection results and computation results. In FIG. 6, terminal layout positions are illustrated. In detection results, the layout position of the first terminal IN is detected to be P1(−a,0), while the layout position of the first terminal OUT is detected to be P2(a,0).

In computation results, a layout position P1'(0,−a), which is obtained by rotating a 90 degree on the center of the cell from the layout position P1(−a,0), is calculated as the layout position of the second terminal IN. A layout position P2'(0,a), which is obtained by rotating a 90 degree from the layout position P2(a,0), is calculated as the layout position of the second terminal OUT. The computation results may be stored in a storage apparatus such as the RAM 303, the magnetic disk 305, or the optical disc 307.

The associating unit 403 associates the second terminal layout positions calculated or computed by the computing unit 402 with the first terminal layout positions and with the layout data 200. For example, the associating unit 403 may generate a table including the layout data 200, the first terminal layout positions and the second terminal layout positions. The generated table may correspond to the table illustrated in FIG. 2.

The outputting unit 406 outputs the association results associated by the associating unit 403. For example, the associating unit 403 may output the table. The association results may also be displayed on the display 308, output to the printer 313, or transmitted to an external apparatus by the I/F 309. The association results may also be stored in a storage apparatus such as the RAM 303, the magnetic disk 305, or the optical disc 307.

The inserting unit 404 inserts a terminal at one of the second terminal layout positions in the layout data 200 for each second terminal layout position associated with the layout data 200 by the associating unit 403. For example, for each second terminal layout position, the inserting unit 404 may insert an NC layer via hole at the layout position of a second terminal in the layout data 200.

The connecting unit 405 couples the first terminal and the second terminal based on the second terminal layout position where the second terminal has been inserted by the inserting unit 404 and the first terminal layout position associated with the second terminal layout position. For example, the connecting unit 405 may couple the NC layer via hole corresponding to the first terminal IN to the NC layer via hole corresponding to the second terminal IN through LB layer wiring, an NB layer via hole and LA layer wiring. The connecting unit 405 may also couple the NC layer via hole corresponding to the first terminal OUT to the NC layer via hole corresponding to the second OUT terminal OUT through LB layer wiring, an NB layer via hole and LA layer wiring.

The CPU 301 may also perform operations corresponding to the inserting unit 404 and the connecting unit 405 by supplying the association results to an automatic wiring tool and then executing the automatic wiring tool.

Figure 7A:
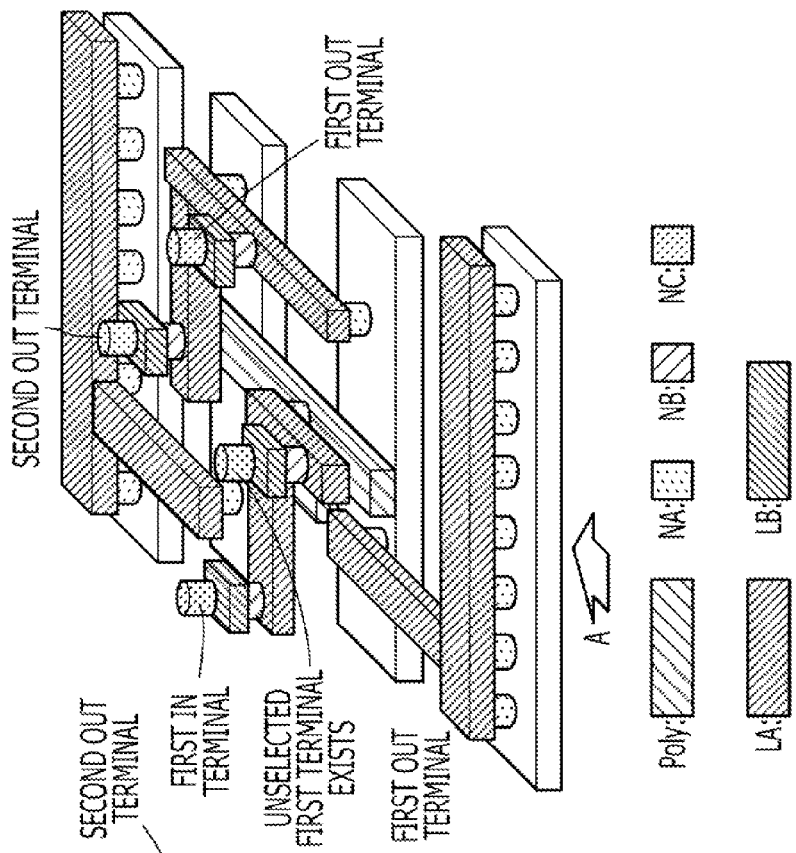
FIGS. 7A and 7B illustrate an exemplary layout data.
Figure 7B:
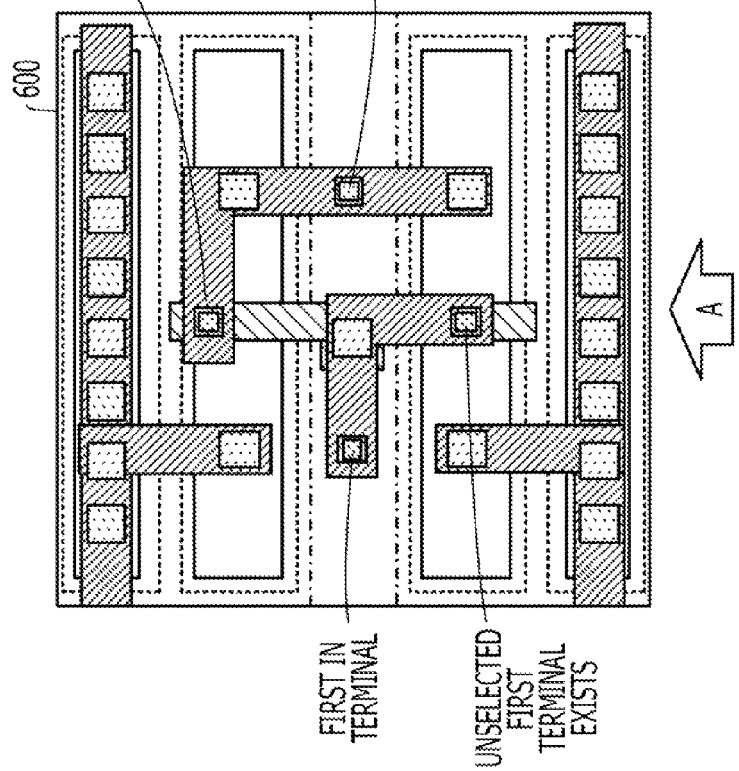

FIGS. 7A and 7B illustrate an exemplary layout data. The layout data illustrated in FIGS. 7A and 7B may be connection results output from the connecting unit 405. In the layout data 600 illustrated in FIG. 7A, a second terminal is inserted and is coupled to a first terminal. In the three-dimensional representation of the layout data 600 illustrated in FIG. 7B, the first terminal IN and the second terminal IN are coupled through via LA layer wiring, which is positioned lower than the NC layer, and the first terminal OUT and the second terminal OUT are coupled.

Figure 8:
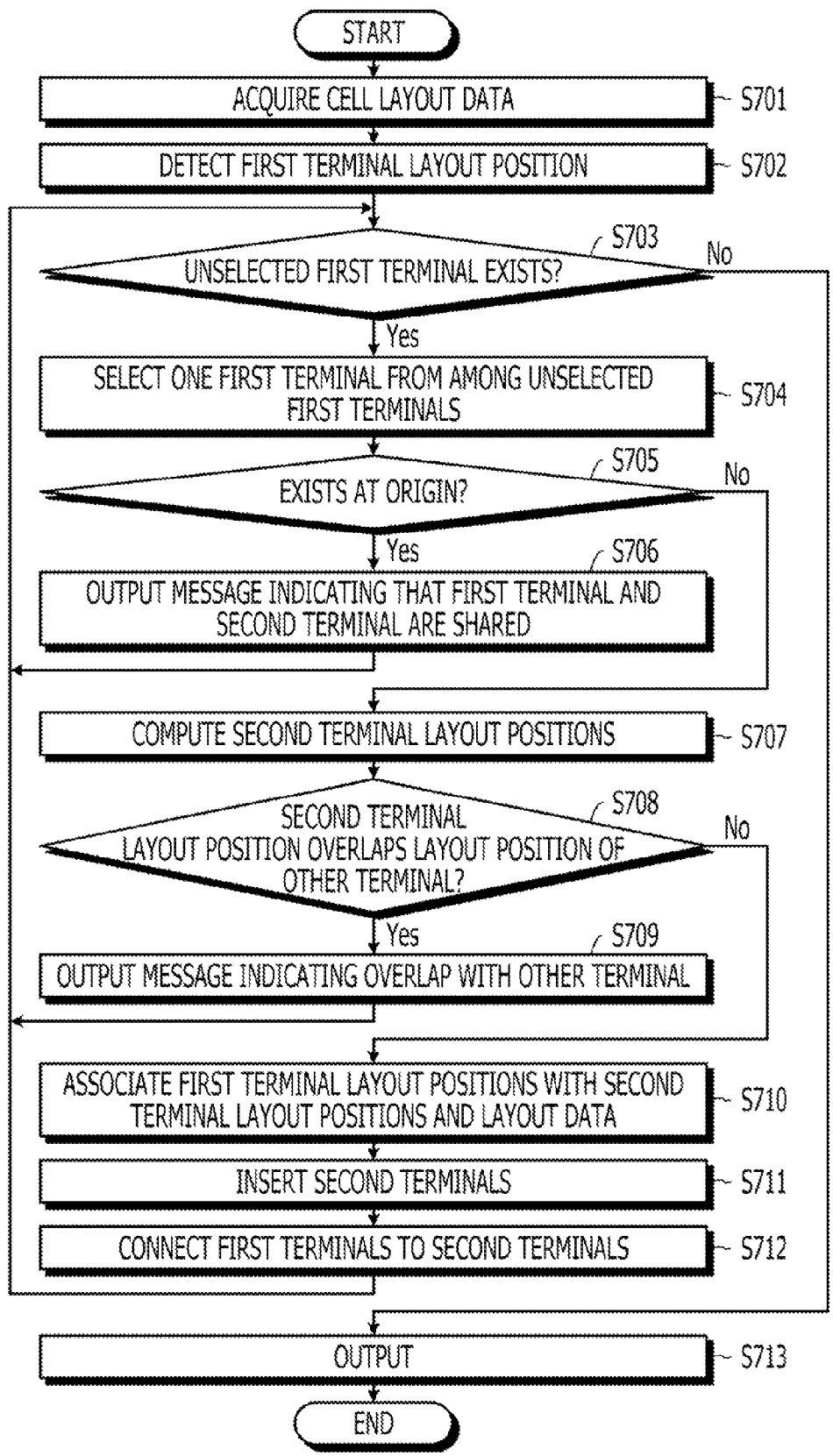
FIG. 8 illustrates an exemplary design support process.

FIG. 8 illustrates an exemplary design support process. The design support process illustrated in FIG. 8 may also be conducted by the design support apparatus 400. In operation S701, layout data of circuit cells within a macro arranged at a plurality of orientations is acquired from a storage apparatus. In operation S702, the detecting unit 401 detects a first terminal layout position in one cell. The detecting unit 401 may detect a layout position for each terminal (e.g., a first IN terminal and a first OUT terminal) within the one cell from the layout data, and treat the detected layout position(s) as the first terminal layout position(s).

In operation S703, it is determined whether there exists an unselected first terminal. If the unselected first terminal does exist (operation S703: Yes), one of the first terminals is selected from among the one or more unselected first terminals in operation S704.

In operation S705, it is determined whether a layout position of a first terminal is at the center of the cell, for example. If the first terminal is at the origin (operation S705: Yes), the outputting unit 406 outputs information indicating that the first terminal and a second terminal are shared in operation S706. The process then returns to the operation S703. If the first terminal is not at the origin (operation S705: No), the processes from the computing unit 402 to the connecting unit 405 may not be performed because the first terminal and the second terminal exist at substantially the same position.

If there is not a first terminal at the origin (operation S705: No), the computing unit 402 calculates the second terminal layout position based on the first terminal layout position in operation 707. In operation S708, it is determined whether or not the second terminal layout position overlaps the layout position of another terminal. If layout position overlaps (operation S708: Yes), information is output indicating that the layout position overlaps with another terminal in operation S709. The process then returns to the operation S703.

If the second terminal layout position does not overlap the layout position of another terminal (operation S708: No), then in operation S710, the associating unit 403 associates first terminal layout position with the second terminal layout position and the layout data. In operation S711, the inserting unit 404 inserts a terminal at the second terminal layout position. Via holes in a certain via layer may also be inserted. In operation S712, the first terminal and the second terminal are coupled through connecting wire in a wiring layer which is positioned lower than the certain terminal layer. The process then returns to the operation S703.

If an unselected second terminal does not exist (operation S703: No), the outputting unit 406 outputs in operation S713, and the process ends.

A macro where cells including a first terminal and a second terminal are arranged according to the macro orientation is converted to another orientation. The macro orientation may also be automatically converted from vertical to horizontal. The orientation as well as the wire connection of the cells arranged within the macro may be maintained.

Figure 9:
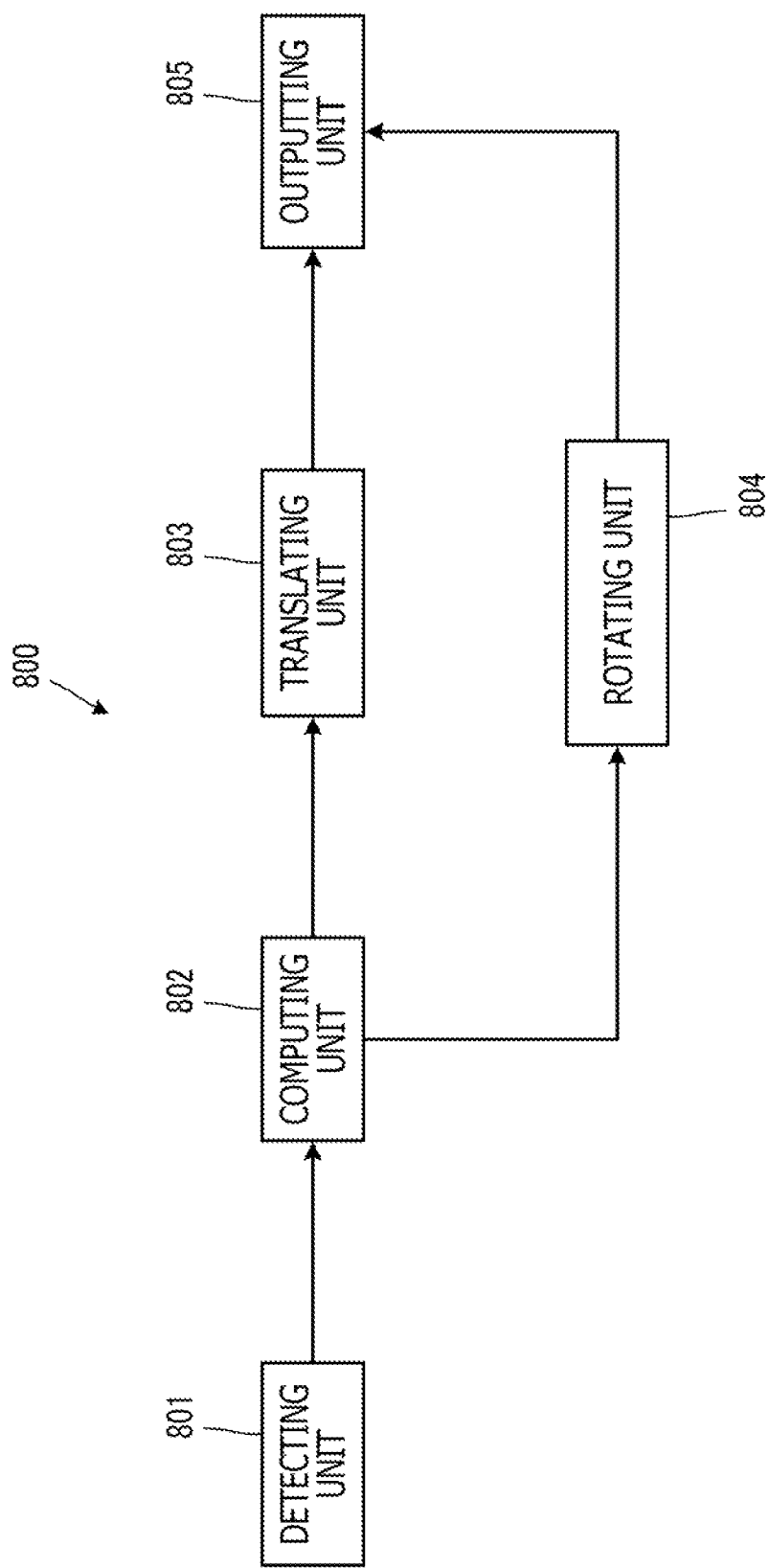
FIG. 9 illustrates an exemplary design support apparatus.

FIG. 9 illustrates an exemplary design support apparatus. The design support apparatus 800 includes a detecting unit 801, a computing unit 802, a translating unit 803, a rotating unit 804, and an outputting unit 805. The elements from the detecting unit 801 to the outputting unit 805 may be implemented by the CPU 301 executing programs stored in a storage apparatus such as the ROM 302, the RAM 303, the magnetic disk 305, or the optical disc 307 illustrated in FIG. 4.

Figure 10:
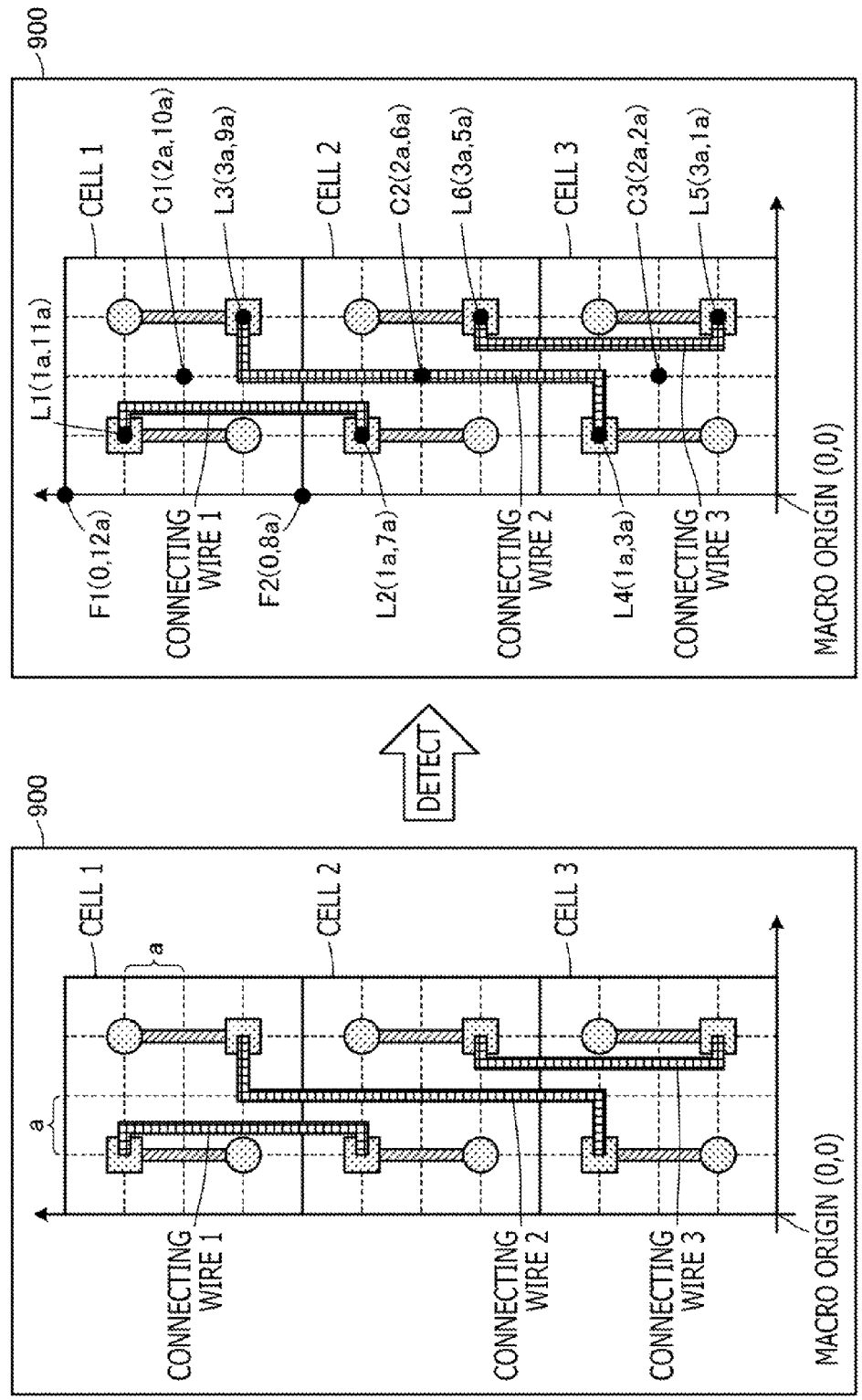
FIG. 10 illustrates exemplary detecting layout positions.

FIG. 10 illustrates an exemplary detecting layout position. In FIG. 10, the layout position of first cell and the layout position of first connecting wires may be detected. In the layout data 900, the grid size may be "a." In the layout data 900, a plurality of cells 1 to 3 are arranged vertically. The plurality of cells 1 to 3 include first terminals used in the vertical orientation, and second terminals used in the horizontal orientation.

The shapes of individual cells, such as the cell frames, may be a shape whose length in one orientation is substantially equal to length in the other orientation. For example, the cell shapes may be square, circular, or similar shapes. For example, the cell frames which indicate the cell boundaries may be square. The origin (0,0) of the layout data 900 may be at the lower-left position in FIG. 10.

The NC layer square arranged within each cell indicates first terminal, while the NC layer circle indicates second terminal. Pairs of a first terminal square and a second terminal circle are coupled via wiring in a lower layer than the NC layer. In the layout data 900, cells are coupled to each other by the first terminal squares. The cell 1 and the cell 2 are coupled by a connecting wire 1, the cell 1 and the cell 3 are coupled by a connecting wire 2, and the cell 2 and the cell 3 are coupled by a connecting wire 3. The layout data 900 includes physical information. The layout data 900 includes the layout position of the individual cell and the layout position of the individual connecting wire. Since the connecting wire 1 is shaped like a backward "C", the layout data 900 includes coordinates of four endpoints. The layout data 900 may also be stored in a storage apparatus accessible by the CPU 301.

From the layout data 900, the detecting unit 801 detects the layout position of the first cell by detecting the center position of each cell. From the layout data 900, the detecting unit 801 detects the layout position of the first connecting wire by detecting the connecting wire that couples the cells.

For example, the detecting unit 801 may detect the center position of cell 11, C1(2a,10a), as the first layout position of cell 1. The detecting unit 801 may detect the center position of cell 2, C2(2a,6a), as the first cell layout position of cell 2. The detecting unit 801 may detect the center position of cell 3, C3(2a,2a), as the first layout position of cell 3. The coordinates F1(0,12a) and F2(0,8a) and the center position of cell 1 are detected for the translation process performed by the translating unit 803. The detecting unit 801 may simply detect a center position and at least two other positions in a cell.

For example, from the layout data 900, the detecting unit 801 may detect a position of the connecting wire as a first connecting wire layout position for each connecting wire between cells. The first connecting wire layout position of the connecting wire 1 may be L1(1a,11a) and L2(1a,7a). Since the connecting wire 1 is shaped like a backward "C", the layout data 900 includes coordinates of four endpoints as information for the connecting wire 1. In order to change the orientation of the connecting wire 1, the four coordinates may be converted to displaced positions. The processes of the computing unit 802 and the rotating unit 804 may be substantially the same or similar regardless of position.

The first connecting wire layout position of the connecting wire 2 may be L3(3a,9a) and L4(1a,3a) and the first connecting wire layout position of the connecting wire 3 may be L5(3a,1a) and L6(3a,5a).

For each cell, the computing unit 802 illustrated in FIG. 9 calculates a second cell layout position in a horizontally-oriented macro based on the variation from the vertical orientation to the horizontal orientation and the first cell layout position detected by the detecting unit 801. For example, the computing unit 802 may set a position obtained by rotating a 90 degree from the first cell layout position on a given position to the second cell layout position. The given position may be the macro origin. For example, the computing unit 802 may calculate by substituting the first cell layout position into the following Equation 22.

$$\vec{C}' = \begin{pmatrix} \cos 90° & -\sin 90° \\ \sin 90° & \cos 90° \end{pmatrix} \times \vec{C} \qquad (2)$$
$$= \begin{pmatrix} 0 & -1 \\ 1 & 0 \end{pmatrix} \times \vec{C}$$

The vector C indicates the first cell layout position. If the equation 2 is used when a first cell layout position is C(x,y), the second cell layout position may be C'(−y,x).

Figure 11:
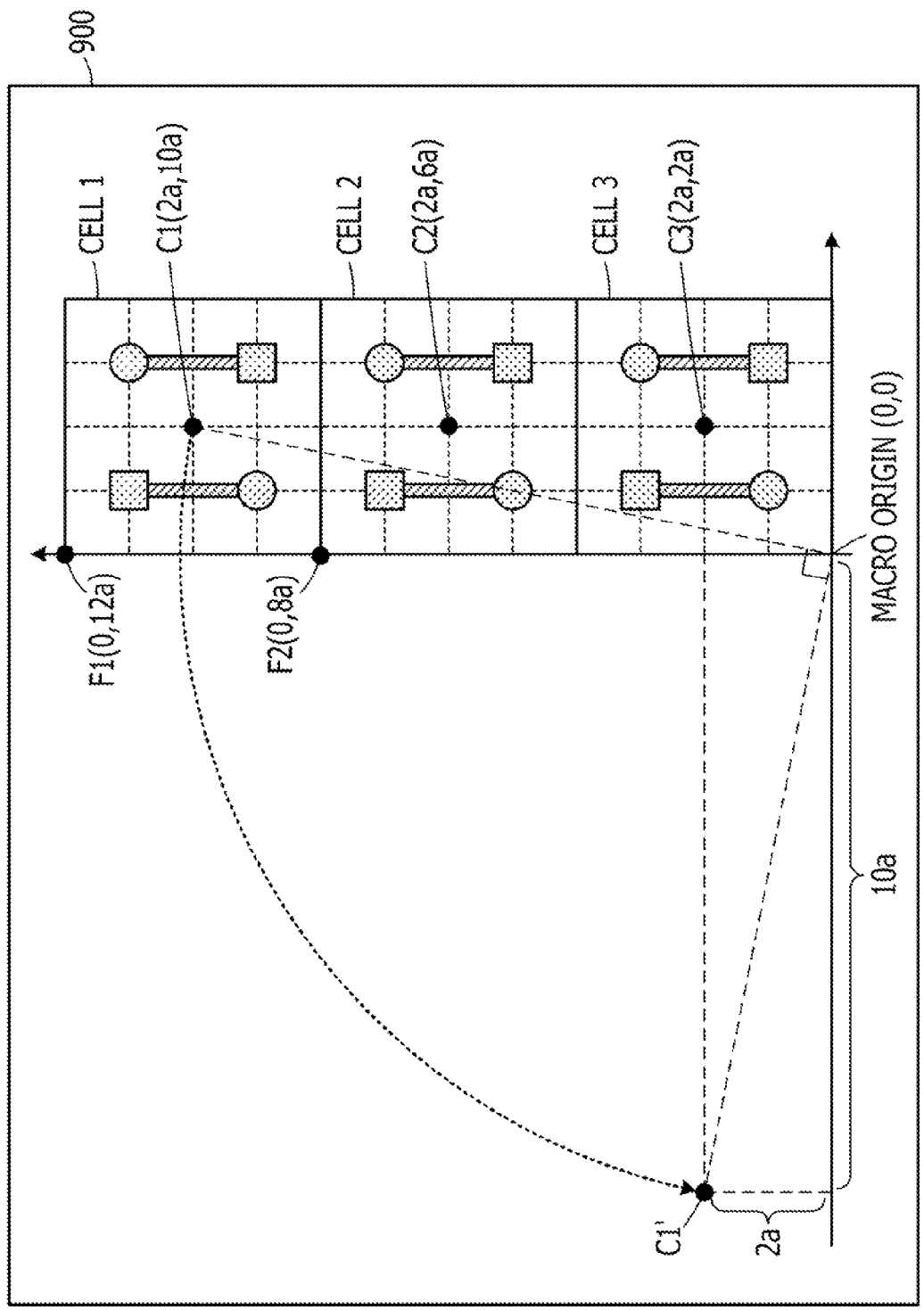
FIG. 11 illustrates exemplary computing layout positions.

FIG. 11 illustrates an exemplary computing layout position. The second cell layout position of cell 1 may be calculated. In FIG. 11, the wiring that couples cells may be omitted. The second cell layout position of cell 1, which is obtained by rotating a 90 degree from the first cell layout position of cell 1, C1(2a,10a) on the origin, may be C1'(−10a,2a). Although not illustrated in FIG. 11, the second cell layout position of cell 2 may be C2'(−6a,2a) and the second cell layout position of cell 3 may be C3'(−2a,2a).

The computing unit 802 calculates a second cell layout position of a horizontally-oriented macro in a position other than the center position of the cell. The computing unit 802 calculates F1' which corresponds to the second cell layout position of F1 by substituting C1' corresponding to the second cell layout position of cell 1, F1 and C1 into Equation 3.

$$\vec{F1'} = \vec{C1'} + (\vec{F1} - \vec{C1}) \qquad (3)$$

Since the difference between F1 and C1 is (−2a,2a), F1' is (−12a,4a). Similarly to F1, the second cell layout position F2' calculated by the computing unit 802 becomes (12a,0). The computing unit 802 may perform a similar operation on cell 2 and cell 3.

The translating unit 803 illustrated in FIG. 9 translates cells based on the first cell layout position and the second cell layout position calculated by the computing unit 802 for each cell.

Figure 12:
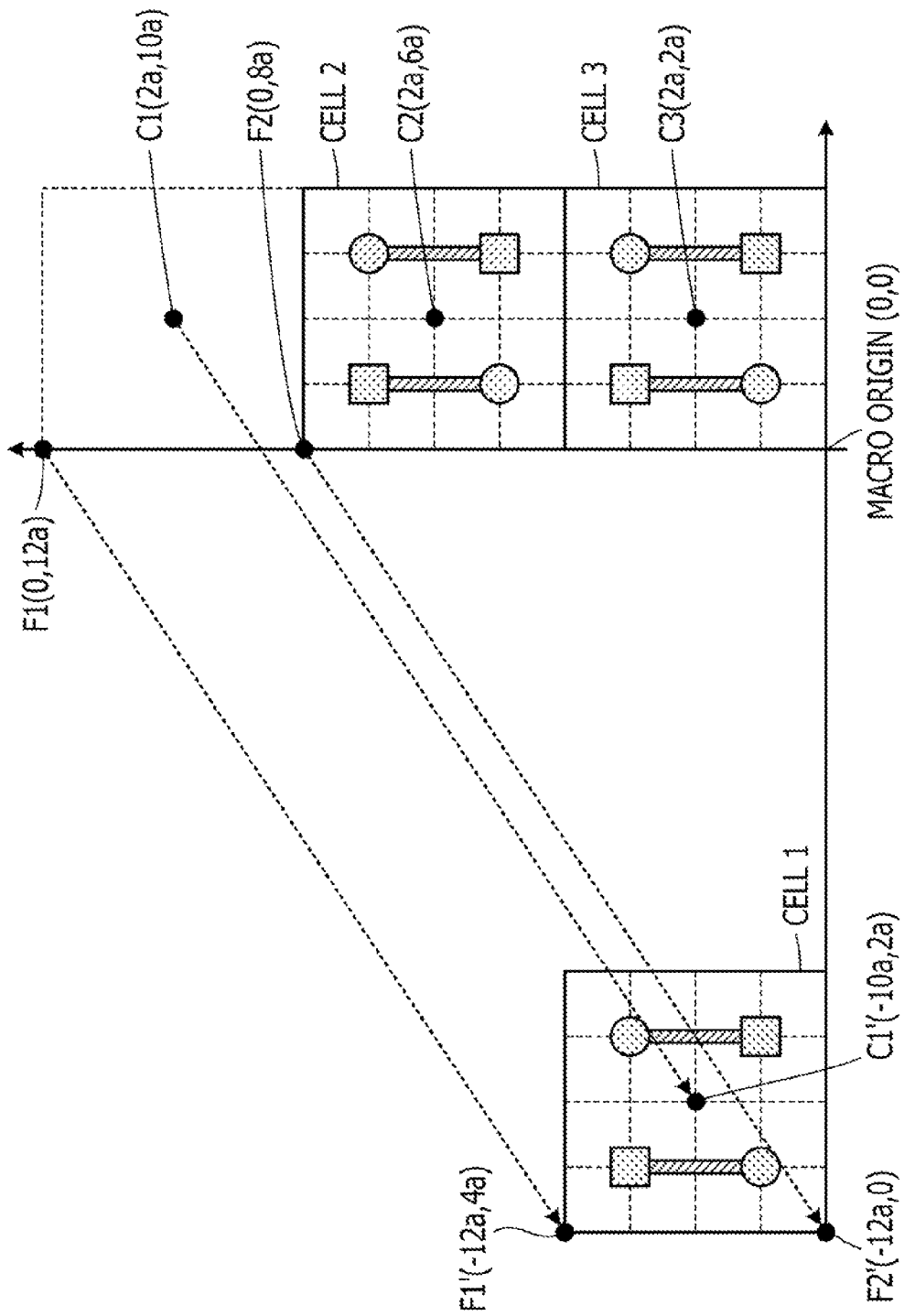
FIG. 12 illustrates an exemplary translation process.

FIG. 12 illustrates an exemplary translation process. For example, the translating unit 803 converts the first cell layout position of cell 1 into the second cell layout position of cell 1. The center position of cell 1 may be converted from C1(2a, 10a) to C1'(−10a,2a). The translating unit 803 may translate the cell 1 by converting the cell layout position from F1 to F1' and from F2 to F2', for example. Although not illustrated in FIG. 12, cell 2 and cell 3 may also be translated by the translating unit 803 similarly to cell 1.

The computing unit 802 illustrated in FIG. 9 calculates a connecting wire layout position in the horizontal orientation, for each connecting wire between the cells, based on the variation from the vertical orientation to the horizontal orientation and the first connecting wire layout position detected by the detecting unit 801. The second connecting wire layout position may be obtained by rotating a 90 degree from the first connecting wire layout position on the macro origin. For example, the computing unit 802 may calculates each second connecting wire layout position by substituting the first connecting wire layout position into Equation 4.

$$\vec{L'} = \begin{pmatrix} \cos 90° & -\sin 90° \\ \sin 90° & \cos 90° \end{pmatrix} \times \vec{L} \quad (4)$$

$$= \begin{pmatrix} 0 & -1 \\ 1 & 0 \end{pmatrix} \times \vec{L}$$

The vector L in Equation 4 indicates the first connecting wire layout position. When a first connecting wire layout position is L(x,y), the second connecting wire layout position may be L'(-y,x).

Figure 13:
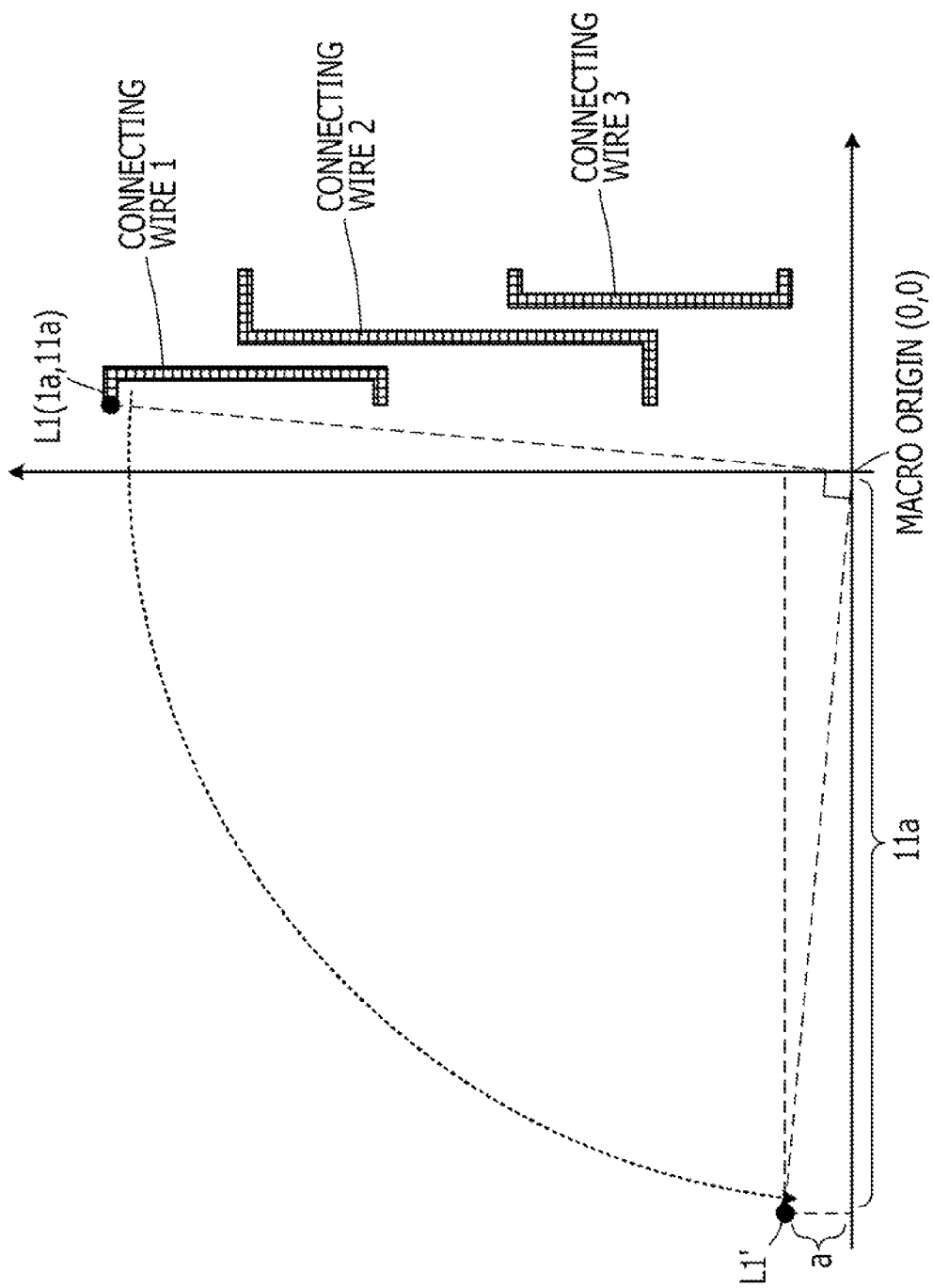
FIG. 13 illustrates exemplary computing connecting wire layout positions.

FIG. 13 illustrates an exemplary computing connecting wire layout position. The second connecting wire layout position of connecting wire L1 calculated based on the endpoint L1(1a,11a) of connecting wire 1 may be L1'(-11a,1a). The second connecting wire layout position for L2 calculated based on the endpoints L2(1a, 7a) of the connecting wire 1 may be L2'(-7a,1a).

The rotating unit 804 illustrated in FIG. 9 rotates from a first connecting wire layout position to a second connecting wire layout position.

Figure 14:
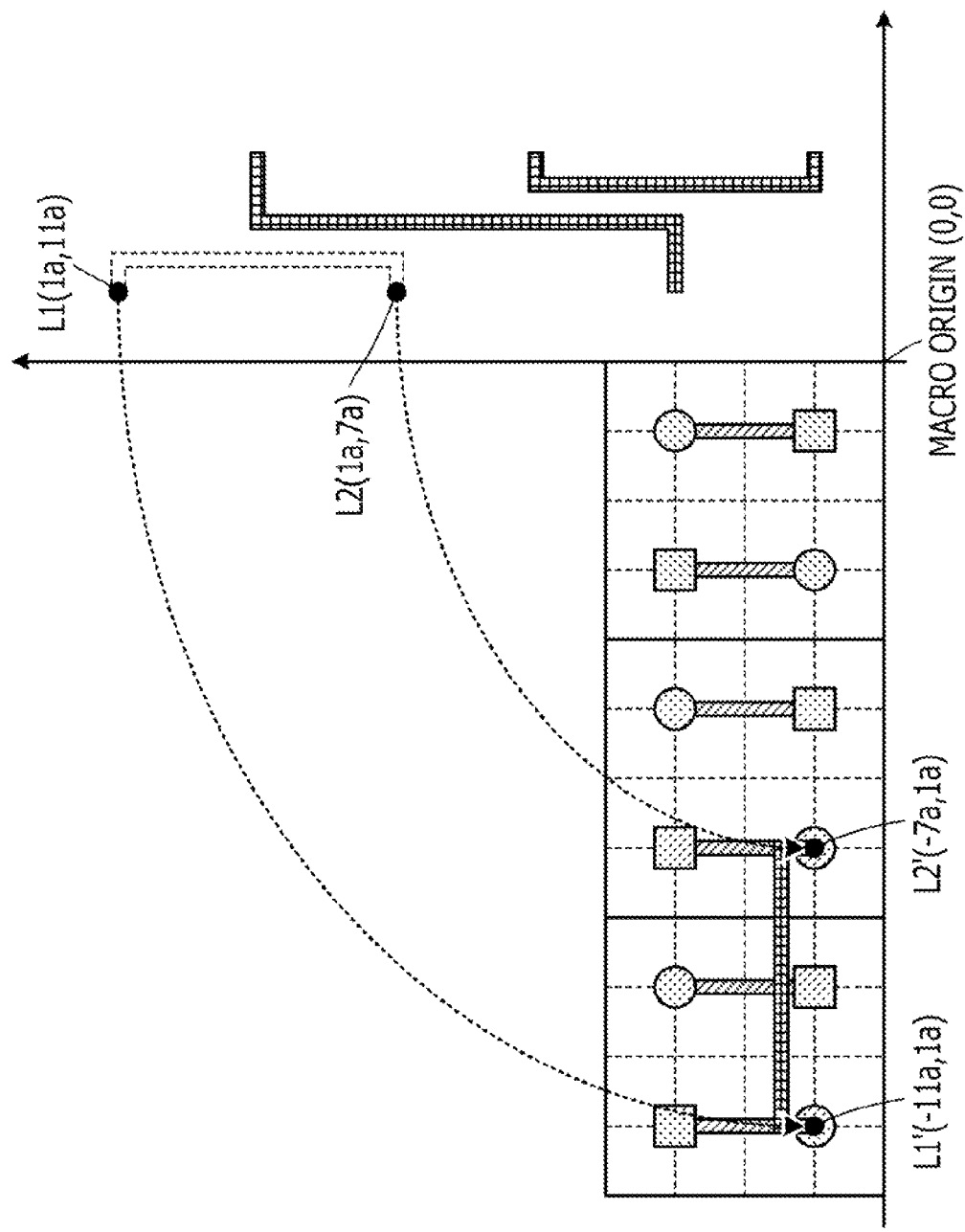
FIG. 14 illustrates an exemplary rearranging the connecting wire layout.

FIG. 14 illustrates an exemplary rearranging a connecting wire layout. The connecting wire 1 may be rearranged by a rotation process. The rotating unit 804 converts the L1 and L2 of the connecting wire 1 into L1' and L2', respectively. In FIG. 14, the connecting wire 1 is rearranged to a position obtained by rotating a 90 degree rotation on the macro origin. Although not illustrated in FIG. 14, the connecting wire 2 and the connecting wire 3 may also be rearranged to positions obtained by rotating a 90 degree rotation on the macro origin, similarly to the connecting wire 1.

Figure 15:
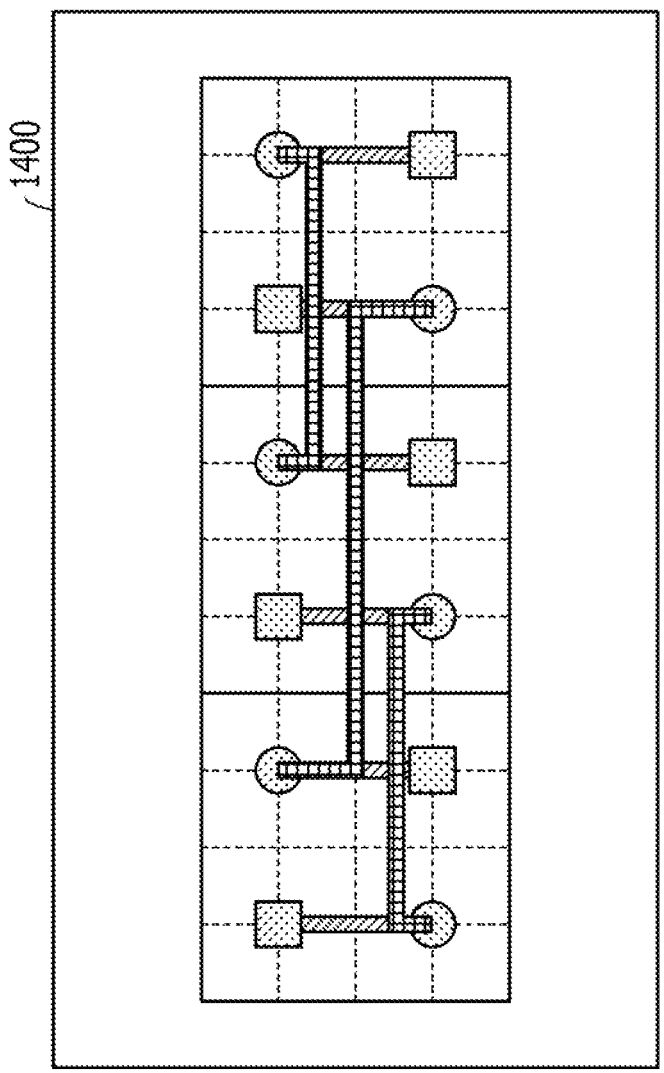
FIG. 15 illustrates an exemplary layout data.

FIG. 15 illustrates an exemplary layout data. The layout data illustrated in FIG. 15 may be layout data subjected to a translation process (i.e., translated layout data). The translated layout data 1400 may be a macro arranged in a horizontal orientation. The layout data 900 includes a first terminal, for example a square terminal. The translated layout data 1400 may also include a second terminal, for example, a circle terminal. The orientation of cells in the layout data 900 and the orientation of cells in the translated layout data 1400 may be substantially the same or similar, and the shapes of individual connecting wires between cells may also be substantially the same or similar. The orientations of the cells are maintained even if the macro orientation is converted. The connecting wires between cells may be also maintained. Rewiring may be reduced, depending on the orientation in which the macro is arranged.

The outputting unit 805 illustrated in FIG. 9 outputs layout data subjected to a translation process and a rotation process. For example, the outputting unit 805 may output the translated layout data 1400. The layout data may be displayed on the display 308, printed by the printer 313, or sent to an external apparatus by the I/F 309, for example. The layout data may also be stored in a storage apparatus such as the RAM 303, the magnetic disk 305, or the optical disc 307.

Whether wire connections are maintained within the macro based on a Layout Versus Schematic (LVS), which is based on the translated layout data 1400 and a net list of the macro, may be checked.

When the macro is vertically-oriented, the first terminal may be used. When the macro is horizontally-oriented, the second terminal is used. The first terminal may be used when the macro is horizontally-oriented, and the second terminals may be used when the macro is vertically-oriented. When the macro is vertically-oriented, the cells within the macro may be vertically-oriented. When the macro is horizontally-oriented, the cells within the macro may be horizontally-oriented. The transistors included in the cells in the macro may be uniformly oriented.

Figure 16:
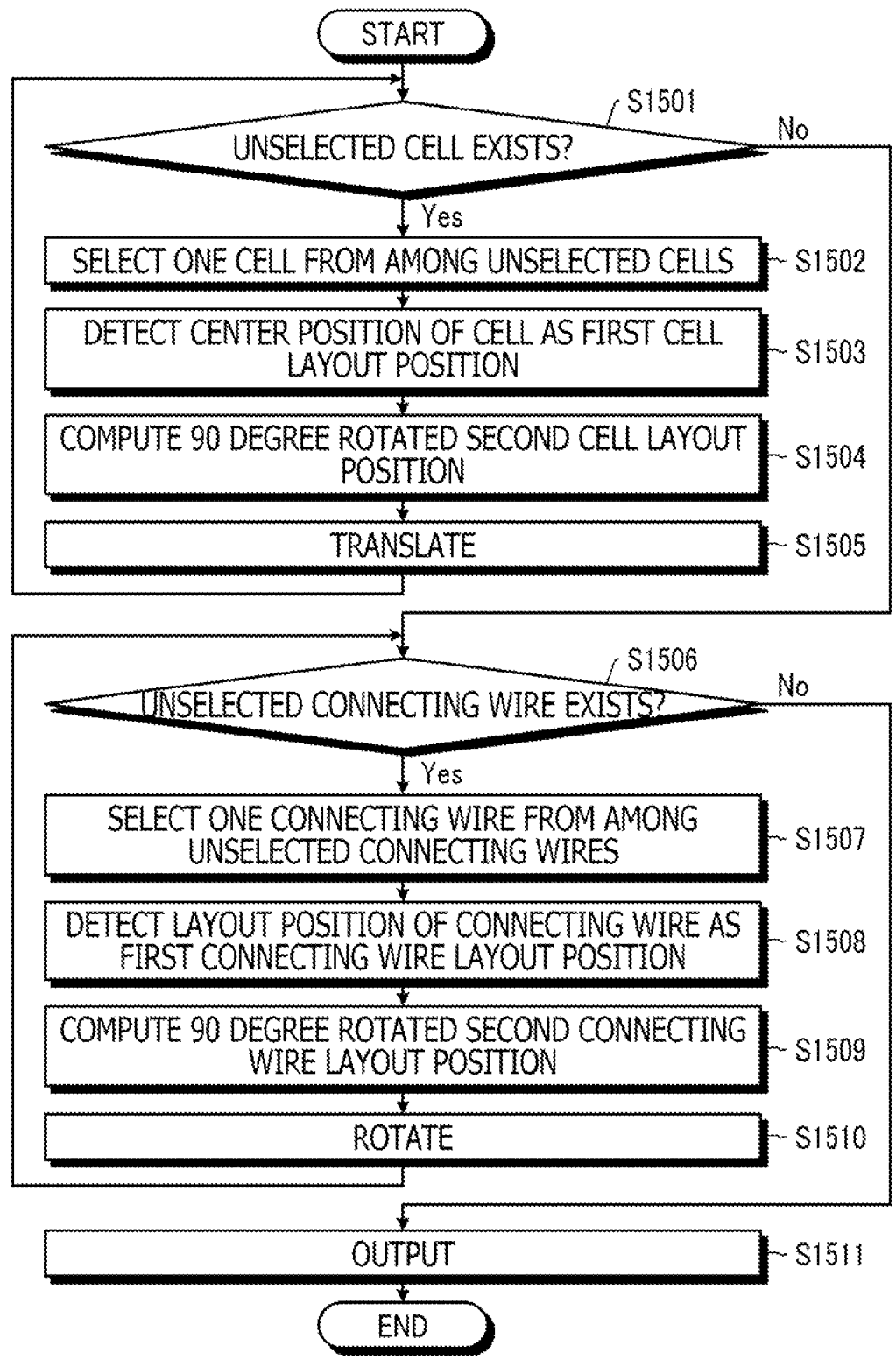
FIG. 16 illustrates an exemplary design support process.

FIG. 16 illustrates an exemplary design support process. The design support apparatus illustrated in FIG. 16 may be executed by the design support apparatus 800. In operation S1501, whether an unselected cell exists in the macro layout data or not is determined. If an unselected cell does exist (operation S1501: Yes), one cell is selected from among the one or more unselected cells (operation S1502).

In operation S1502, the detecting unit 801 detects the center position of the cell as the first cell layout position. In operation S1504, the computing unit 802 calculates a second cell layout position by applying a 90-degree rotation to the first cell layout position. In operation S1505, the translating unit 803 translates the cell based on the first cell layout position and the second cell layout position. The process then returns to operation S1501.

In an unselected cell does not exist (operation S1501: No), the detecting unit 801 determines whether or not an unselected connecting wire exists in the layout data in operation S1506.

In an unselected connecting wire does exist (operation S1506: Yes), one connecting wire is selected from among the one or more unselected connecting wires in operation S1507. In operation S1508, the detecting unit 801 detects the layout position of the connecting wire as the first connecting wire layout position. In operation S1509, the computing unit 802 calculates a second connecting wire layout position by applying a 90 degree rotation to the first connecting wire layout position.

In operation S1510, the rotating unit 804 executes a rotation process based on the first connecting wire layout position and the second connecting wire layout position. The process then returns to operation S1506. The connecting wire is rearranged to the second connecting wire layout position, which is obtained by applying a 90 degree rotation about the macro origin to the first connecting wire layout position.

In an unselected connecting wire does not exist (operation S1506: No), the output process is executed in operation S1511, and the process ends.

Figure 17:
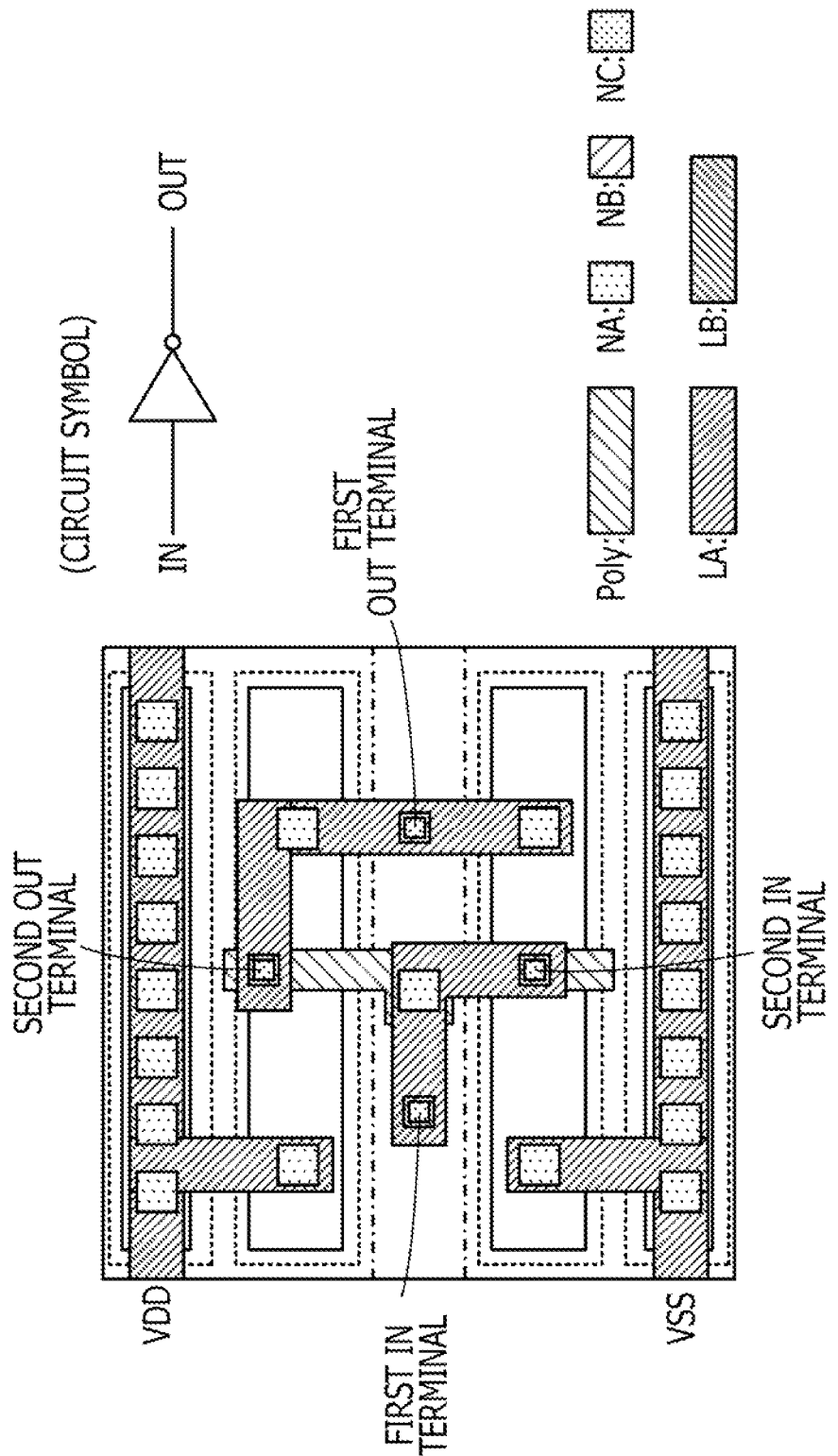
FIG. 17 illustrates an exemplary inverter.

FIG. 17 illustrates an exemplary inverter. The inverter includes an input terminal IN and an output terminal OUT. The inverter includes a diffusion layer zone, a Poly layer gate, LA layer wiring, LB layer wiring, NA layer via holes, NB layer via holes, and NC layer via holes. A common inverter may be used. The inverter includes a first IN terminal and a second IN terminal. The first IN terminal and the second IN terminal are coupled via LA layer wiring. The inverter includes a first OUT terminal and a second OUT terminal. The first OUT terminal and the second OUT terminal are coupled via LA layer wiring.

Either the first terminal or the second terminal may be directly coupled to a external signal line. The other terminal may be electrically coupled to the external signal line via the directly-coupled terminal. In FIG. 16, the external signal lines are not illustrated. The external signal lines may include wiring in a wiring layer that is connectible to the wiring in the LB layer via the NC layer via holes. The external signal lines may also include signals that are input into IN from an external source and signals that are output from OUT to an external destination. The second terminal layout positions may be positions obtained by applying a 90 degree rotation on the center of the inverter to the first terminal layout positions.

Figure 18:
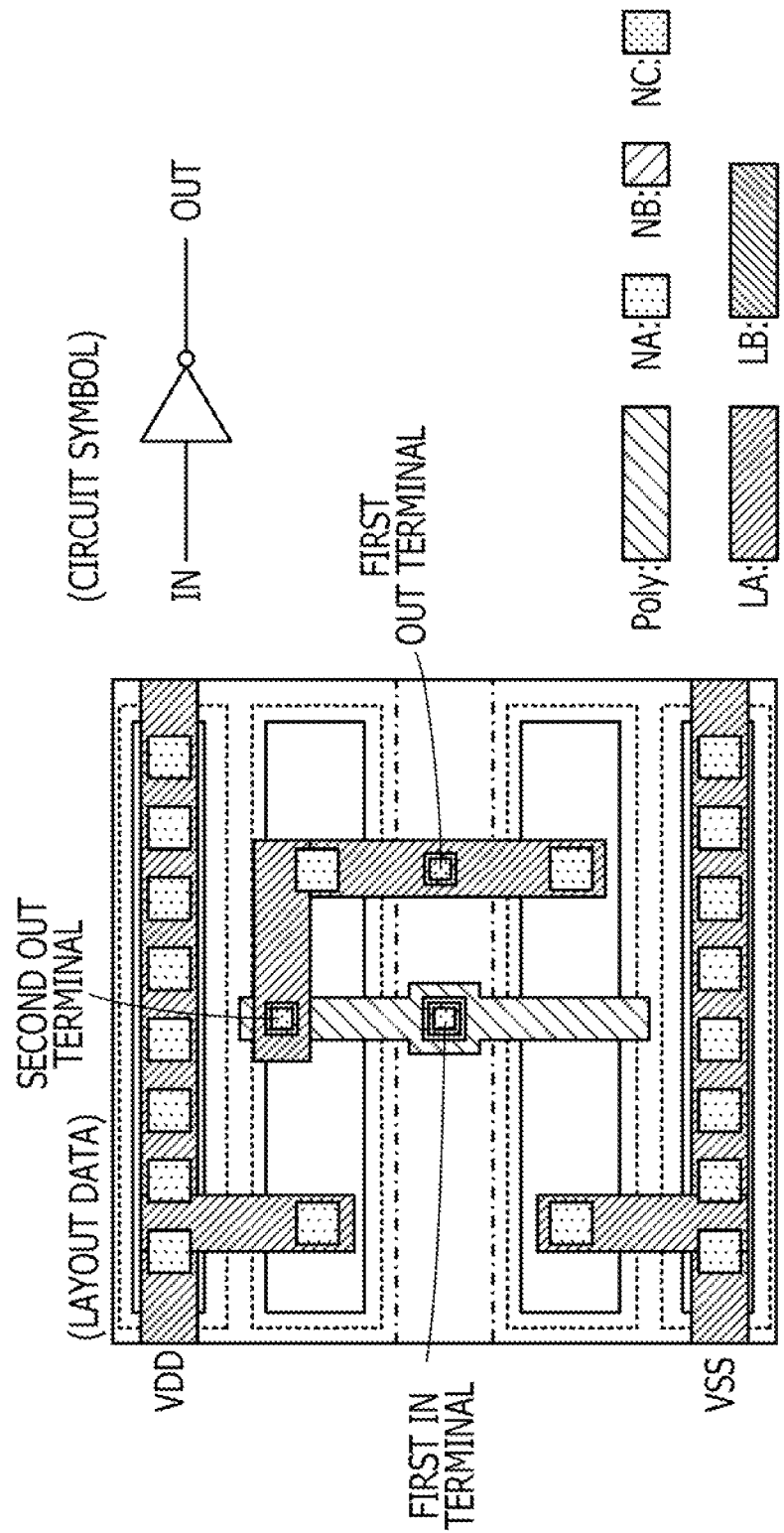
FIG. 18 illustrates an exemplary inverter.

FIG. 18 illustrates an exemplary inverter. A first terminal may be positioned at the center position of the inverter. The first IN terminal layout position is disposed at the center position of the inverter. When the first IN terminal is disposed at the center position of the cell, the first IN terminal and the second IN terminal may be substantially the same or similar.

Figure 19:
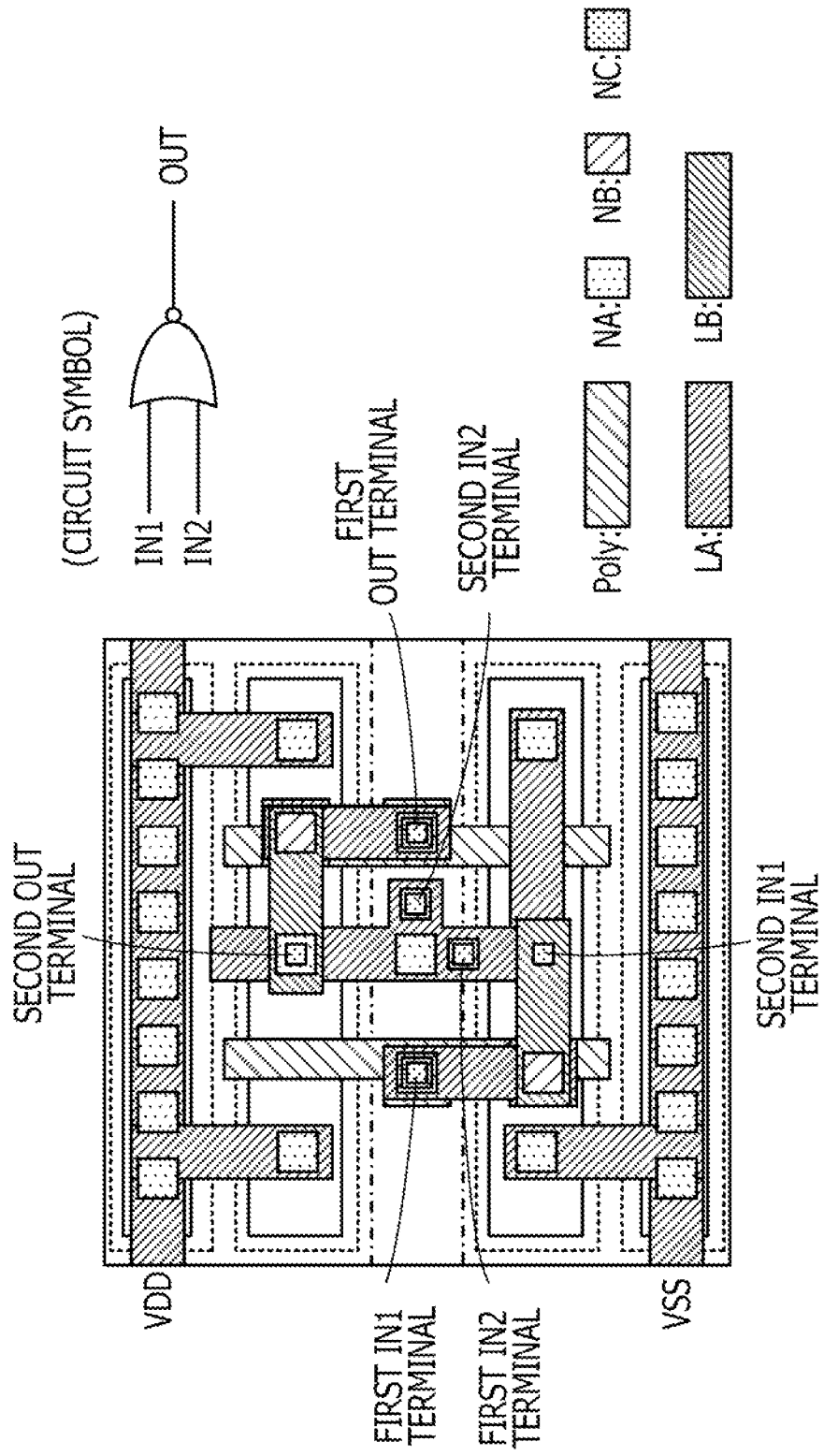
FIG. 19 illustrates an exemplary NAND.

FIG. 19 illustrates an exemplary NAND. The NAND illustrated in FIG. 19 may be a 2-input NAND including a first terminal and a second terminal. The NAND includes input terminals IN1 and IN2, and an output terminal OUT. The NAND includes a first terminal and a second terminal for each of the IN1, IN2, and OUT terminals. Either the first terminal or the second terminal is coupled to an external signal line based on the macro orientation. The 2-input NAND may be a common NAND.

Figure 20:
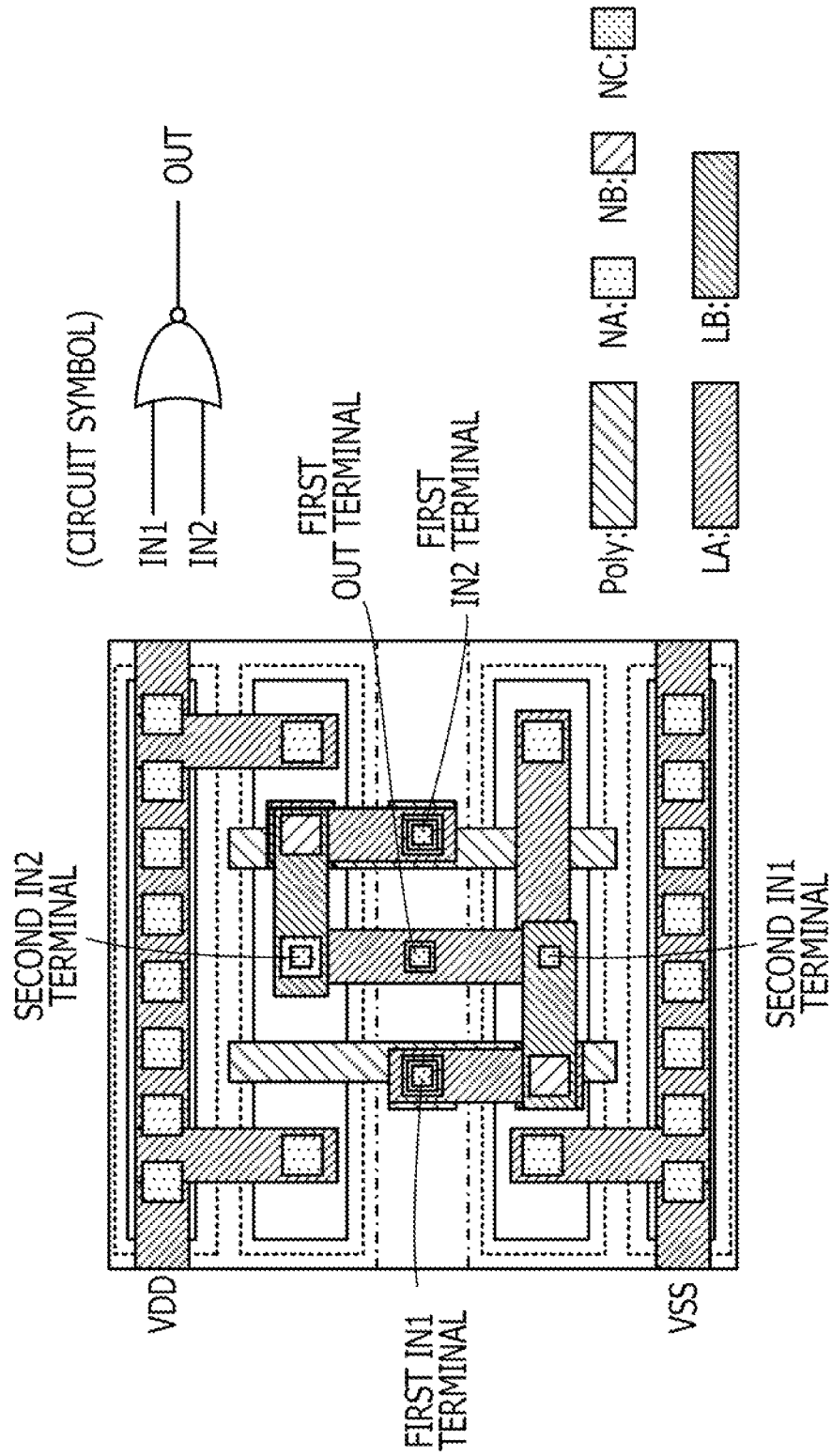
FIG. 20 illustrates an exemplary NAND.

FIG. 20 illustrates an exemplary NAND. A first terminal may be disposed at the center position of the NAND. The first OUT terminal is disposed at the center position of the NAND. Since a first terminal is disposed at the center position, the first terminal and the corresponding second terminal may be substantially the same or similar.

Figure 21:
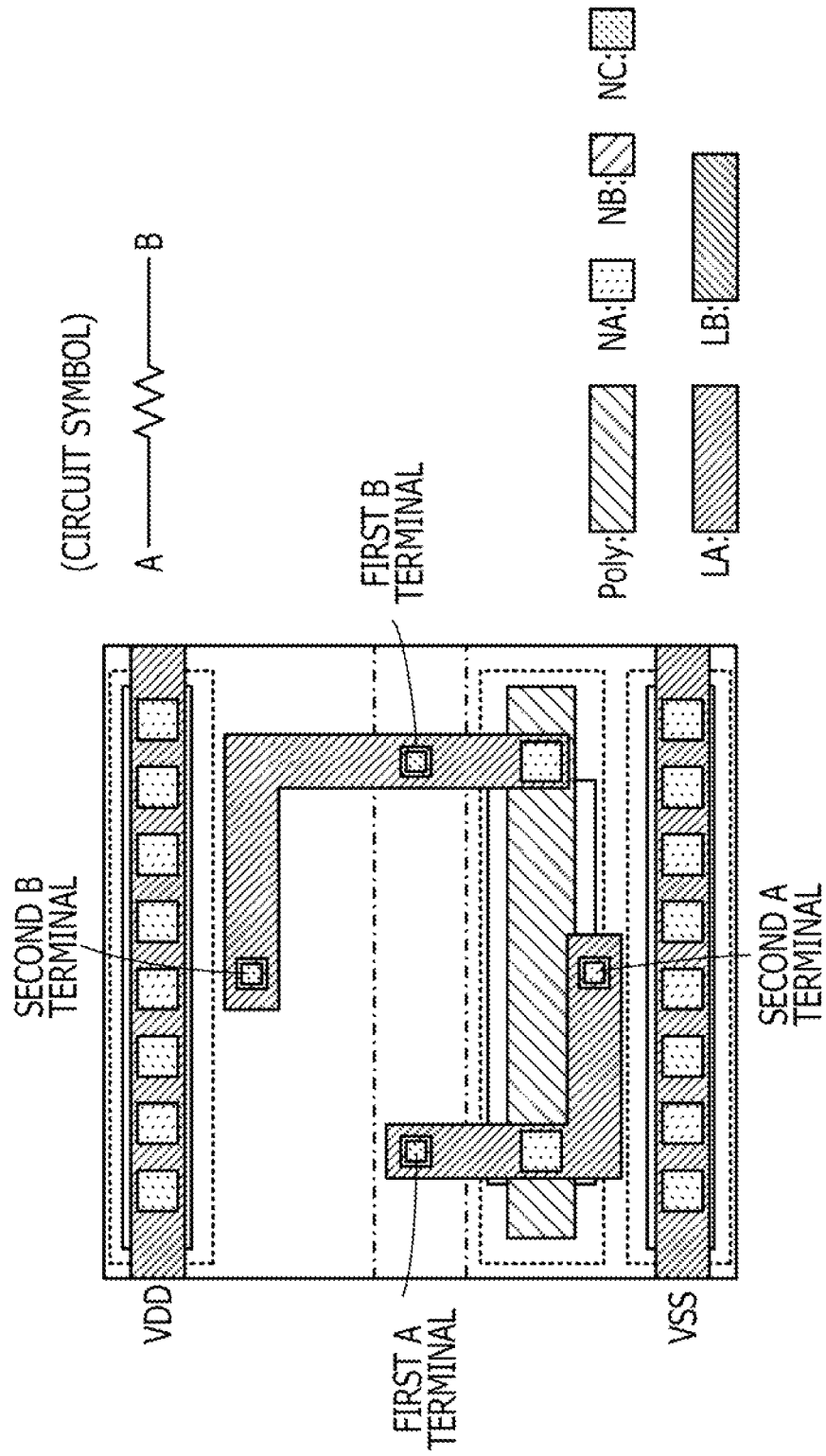
FIG. 21 illustrates an exemplary resistive element.

FIG. 21 illustrates an exemplary resistive element. The resistive element illustrated in FIG. 21 may include a first terminal and a second terminal. The resistive element illustrated in FIG. 21 may be a Poly resistive element, and may include terminals A and B, which are coupled to external signal lines. A first terminal and a second terminal are included for each of the A and B terminals. Either the first terminal or the second terminal is coupled to the external signal line based on the macro orientation. The resistive element may be a common resistive element.

Figure 22:
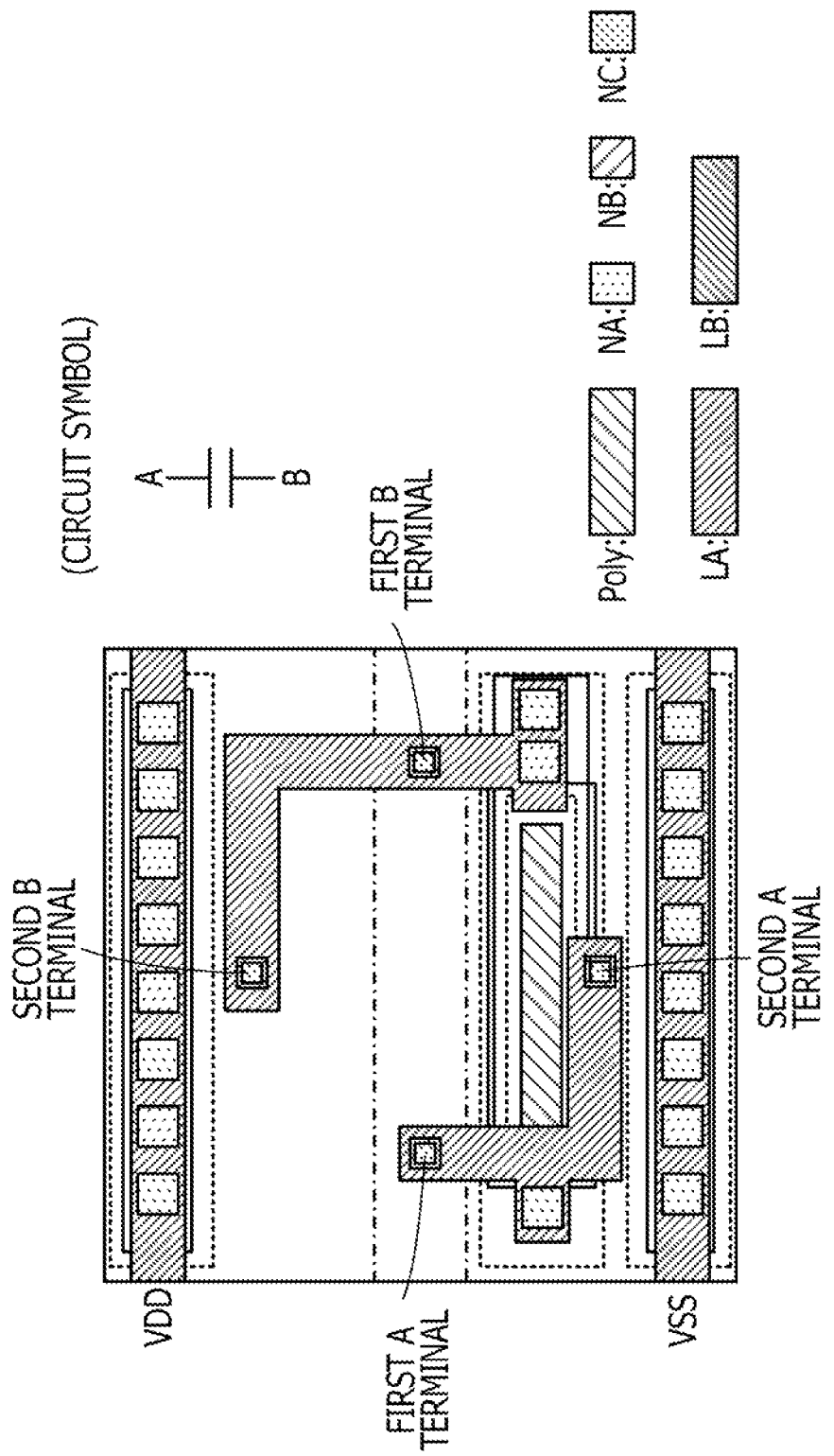
FIG. 22 illustrates an exemplary capacitive element.

FIG. 22 illustrates an exemplary capacitive element. The capacitive element illustrated in FIG. 22 includes a first terminal and a second terminal. The capacitive element includes terminals A and B, which are coupled to external signal lines. A first terminal and a second terminal are included for each of the A and B terminals. Either the first terminal or the second terminal is coupled to the external signal line based on the macro orientation. The capacitive element may be a common capacitive element.

FIG. 23 illustrates an exemplary macro orientation. In FIG. 23, a vertically-oriented macro and a horizontally-oriented macro are illustrated. The vertically-oriented macro and the horizontally-oriented macro include an element 1, an element 2, and an element 3, which are disposed with substantially the same orientation. The elements 1, 2, and 3 include first terminals indicated by squares and second terminals indicated by circles. The vertically-oriented macro includes a first terminal, while the horizontally-oriented macro includes a second terminal. The shapes of the connecting wires that couple elements in the vertically-oriented macro and the horizontally-oriented macro may be substantially the same or similar.

A design support method may be recorded onto a computer-readable recording medium, such as a hard disk, a flexible disk, a CD-ROM, an MO, or a DVD. A design support program may also be read from a recording medium and executed by a computer. The design support program may also be distributed via a network such as the Internet.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A design support method, comprising:
detecting, by a computer, a layout position of a first terminal in a cell as a first layout position from layout data including a plurality of cells arranged in a plurality of orientations in a macro, the first terminal being arranged at a first orientation included in the plurality of orientations;
calculating, by the computer, a second layout position of a second terminal which is arranged at a second orientation which is different from the first orientation based on a variation from the first orientation to the second orientation and the first layout position;
detecting, by the computer, whether the second layout position of the second terminal overlaps a layout position of another terminal of the cell;
outputting, by the computer, information indicating an overlap when the second layout position of the second terminal overlaps the layout position of another terminal of the cell, and repeating the detecting of the layout position of the first terminal in the cell;
associating, by the computer, the second layout position with the first layout position and the layout data, and inserting a second terminal at the second layout position and coupling the second terminal to the first terminal when the second layout position of the second terminal does not overlap the layout position of another terminal of the cell; and
outputting, by the computer, an association result.

2. The design support method according to claim 1, wherein
the second terminal couples to the first terminal through a wire in a wiring layer positioned lower a than a terminal layer.

3. The design support method according to claim 1, further comprising:
setting as the second layout position a position obtained by applying a 90-degree rotation, on a center position of the first cell, to the first layout position; and
associating the second layout position with the first layout position and the layout data.

4. The design support method according to claim 1, wherein the calculating, the associating and the outputting are skipped when the first layout position indicates a center of the cell.

5. A design support apparatus, comprising:
a processor configured to execute operations as units, the units include,
a detecting unit which detects a layout position of a first terminal in a cell as a first layout position from layout data including a plurality of cells arranged in a plurality of orientations in a macro, the first terminal being arranged at a first orientation;
a calculating unit which calculates a second layout position of a second terminal which is arranged at a second orientation which is different from the first orientation based on the variation from the first orientation to the second orientation and as well as the first layout position;
an associating unit which associates the second layout position with the first layout position and the layout data; and
an outputting unit which outputs an association result from the associating unit,
wherein the associating unit detects whether the second layout position of the second terminal overlaps a layout position of another terminal of the cell, outputs information indicating an overlap when the second layout position of the second terminal overlaps the layout position of another terminal of the cell, and, when the second layout position of the second terminal does not overlap the layout position of another terminal of the cell, associates the second layout position with the first layout position and the layout data, inserts a second terminal at the second layout position and couples the second terminal to the first terminal.

6. The design support apparatus according to claim 4, wherein a calculating operation by the calculating unit, an associating operation by the associating unit and an outputting operation by the outputting unit are skipped when the first layout position indicates a center of the cell.

* * * * *